(12) United States Patent
Moore et al.

(10) Patent No.: US 7,018,863 B2
(45) Date of Patent: Mar. 28, 2006

(54) METHOD OF MANUFACTURE OF A RESISTANCE VARIABLE MEMORY CELL

(75) Inventors: John T. Moore, Boise, ID (US); Kristy A. Campbell, Boise, ID (US); Terry L. Gilton, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 146 days.

(21) Appl. No.: 10/225,190

(22) Filed: Aug. 22, 2002

(65) Prior Publication Data

US 2004/0038480 A1     Feb. 26, 2004

(51) Int. Cl.
*H01L 21/00*     (2006.01)
(52) U.S. Cl. ......................... 438/95; 257/530
(58) Field of Classification Search ................ 438/95, 438/130, 131, 900, 466–469; 257/4, 32, 257/530
See application file for complete search history.

(56) References Cited

U.S. PATENT DOCUMENTS

| | | |
|---|---|---|
| 3,271,591 A | 9/1966 | Ovshinsky |
| 3,622,319 A | 11/1971 | Sharp |
| 3,743,847 A | 7/1973 | Boland |
| 3,961,314 A | 6/1976 | Klose et al. |
| 3,966,317 A | 6/1976 | Wacks et al. |
| 3,983,542 A | 9/1976 | Ovshinsky |
| 3,988,720 A | 10/1976 | Ovshinsky |
| 4,177,474 A | 12/1979 | Ovshinsky |
| 4,267,261 A | 5/1981 | Hallman et al. |
| 4,269,935 A | 5/1981 | Masters et al. |
| 4,312,938 A | 1/1982 | Drexler et al. |
| 4,316,946 A | 2/1982 | Masters et al. |
| 4,320,191 A | 3/1982 | Yoshikawa et al. |
| 4,405,710 A | 9/1983 | Balasubramanyam et al. |
| 4,419,421 A | 12/1983 | Wichelhaus et al. |
| 4,499,557 A | 2/1985 | Holmberg et al. |
| 4,597,162 A | 7/1986 | Johnson et al. |
| 4,608,296 A | 8/1986 | Keem et al. |
| 4,637,895 A | 1/1987 | Ovshinsky et al. |
| 4,646,266 A | 2/1987 | Ovshinsky et al. |
| 4,664,939 A | 5/1987 | Ovshinsky |
| 4,668,968 A | 5/1987 | Ovshinsky et al. |
| 4,670,763 A | 6/1987 | Ovshinsky et al. |
| 4,671,618 A | 6/1987 | Wu et al. |
| 4,673,957 A | 6/1987 | Ovshinsky et al. |
| 4,678,679 A | 7/1987 | Ovshinsky |

(Continued)

FOREIGN PATENT DOCUMENTS

WO    WO 97/48032    12/1997

(Continued)

OTHER PUBLICATIONS

PCT Application WO 00/48196, Kozicki et al., Aug. 17, 2000.*

(Continued)

*Primary Examiner*—David Vu
(74) *Attorney, Agent, or Firm*—Dickstein Shapiro Morin & Oshinsky LLP

(57) ABSTRACT

The invention provides a method of forming a resistance variable memory element and the resulting element. The method includes forming an insulating layer having an opening therein; forming a metal containing layer recessed in the opening; forming a resistance variable material in the opening and over the metal containing layer; and processing the resistance variable material and metal containing layer to produce a resistance variable material containing a diffused metal within the opening.

89 Claims, 7 Drawing Sheets

U.S. PATENT DOCUMENTS

| | | |
|---|---|---|
| 4,696,758 A | 9/1987 | Ovshinsky et al. |
| 4,698,234 A | 10/1987 | Ovshinsky et al. |
| 4,710,899 A | 12/1987 | Young et al. |
| 4,728,406 A | 3/1988 | Banerjee et al. |
| 4,737,379 A | 4/1988 | Hudgens et al. |
| 4,766,471 A | 8/1988 | Ovshinsky et al. |
| 4,769,338 A | 9/1988 | Ovshinsky et al. |
| 4,775,425 A | 10/1988 | Guha et al. |
| 4,788,594 A | 11/1988 | Ovshinsky et al. |
| 4,795,657 A | 1/1989 | Formigoni et al. |
| 4,800,526 A | 1/1989 | Lewis |
| 4,804,490 A | 2/1989 | Pryor et al. |
| 4,809,044 A | 2/1989 | Pryor et al. |
| 4,818,717 A | 4/1989 | Johnson et al. |
| 4,843,443 A | 6/1989 | Ovshinsky et al. |
| 4,845,533 A | 7/1989 | Pryor et al. |
| 4,847,674 A | 7/1989 | Sliwa et al. |
| 4,853,785 A | 8/1989 | Ovshinsky et al. |
| 4,891,330 A | 1/1990 | Guha et al. |
| 4,920,078 A | 4/1990 | Bagley et al. |
| 5,128,099 A | 7/1992 | Strand et al. |
| 5,159,661 A | 10/1992 | Ovshinsky et al. |
| 5,166,758 A | 11/1992 | Ovshinsky et al. |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,296,716 A | 3/1994 | Ovshinsky et al. |
| 5,314,772 A | 5/1994 | Kozicki |
| 5,315,131 A | 5/1994 | Kishimoto et al. |
| 5,330,630 A | 7/1994 | Klersy et al. |
| 5,335,219 A | 8/1994 | Ovshinsky et al. |
| 5,341,328 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,406,509 A | 4/1995 | Ovshinsky et al. |
| 5,414,271 A | 5/1995 | Ovshinsky et al. |
| 5,500,532 A | 3/1996 | Kozicki et al. |
| 5,512,328 A | 4/1996 | Yoshimura et al. |
| 5,512,773 A | 4/1996 | Wolf et al. |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,543,737 A | 8/1996 | Ovshinsky |
| 5,591,501 A | 1/1997 | Ovshinsky et al. |
| 5,596,522 A | 1/1997 | Ovshinsky et al. |
| 5,687,112 A | 11/1997 | Ovshinsky |
| 5,694,054 A | 12/1997 | Ovshinsky et al. |
| 5,714,768 A | 2/1998 | Ovshinsky et al. |
| 5,726,083 A | 3/1998 | Takaishi |
| 5,751,012 A | 5/1998 | Wolstenholme et al. |
| 5,761,115 A * | 6/1998 | Kozicki et al. ............ 365/182 |
| 5,789,277 A | 8/1998 | Zahorik et al. |
| 5,814,527 A | 9/1998 | Wolstenholme et al. |
| 5,818,749 A | 10/1998 | Harshfield |
| 5,825,046 A | 10/1998 | Czubatyj et al. |
| 5,837,564 A | 11/1998 | Sandhu et al. |
| 5,841,150 A | 11/1998 | Gonzalez et al. |
| 5,846,889 A | 12/1998 | Harbison et al. |
| 5,851,882 A | 12/1998 | Harshfield |
| 5,869,843 A | 2/1999 | Harshfield |
| 5,896,312 A | 4/1999 | Kozicki et al. |
| 5,912,839 A | 6/1999 | Ovshinsky et al. |
| 5,914,893 A | 6/1999 | Kozicki et al. |
| 5,920,788 A | 7/1999 | Reinberg |
| 5,933,365 A | 8/1999 | Klersy et al. |
| 5,998,066 A | 12/1999 | Block et al. |
| 6,011,757 A | 1/2000 | Ovshinsky |
| 6,031,287 A | 2/2000 | Harshfield |
| 6,072,716 A | 6/2000 | Jacobson et al. |
| 6,077,729 A | 6/2000 | Harshfield |
| 6,084,796 A | 7/2000 | Kozicki et al. |
| 6,087,674 A | 7/2000 | Ovshinsky et al. |
| 6,117,720 A | 9/2000 | Harshfield |
| 6,141,241 A | 10/2000 | Ovshinsky et al. |
| 6,143,604 A | 11/2000 | Chiang et al. |
| 6,177,338 B1 | 1/2001 | Liaw et al. |
| 6,236,059 B1 | 5/2001 | Wolstenholme et al. |
| RE37,259 E | 7/2001 | Ovshinsky |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,339,544 B1 | 1/2002 | Chiang et al. |
| 6,348,365 B1 * | 2/2002 | Moore et al. ............... 438/130 |
| 6,350,679 B1 | 2/2002 | McDaniel et al. |
| 6,376,284 B1 | 4/2002 | Gonzalez et al. |
| 6,388,324 B1 | 5/2002 | Kozicki et al. |
| 6,391,688 B1 | 5/2002 | Gonzalez et al. |
| 6,404,665 B1 | 6/2002 | Lowery et al. |
| 6,414,376 B1 | 7/2002 | Thakur et al. |
| 6,418,049 B1 * | 7/2002 | Kozicki et al. ............. 365/174 |
| 6,420,725 B1 | 7/2002 | Harshfield |
| 6,423,628 B1 | 7/2002 | Li et al. |
| 6,429,064 B1 | 8/2002 | Wicker |
| 6,437,383 B1 | 8/2002 | Xu |
| 6,440,837 B1 | 8/2002 | Harshfield |
| 6,462,984 B1 | 10/2002 | Xu et al. |
| 6,469,364 B1 | 10/2002 | Kozicki |
| 6,473,332 B1 | 10/2002 | Ignatiev et al. |
| 6,480,438 B1 | 11/2002 | Park |
| 6,487,106 B1 | 11/2002 | Kozicki |
| 6,487,113 B1 | 11/2002 | Park et al. |
| 6,501,111 B1 | 12/2002 | Lowery |
| 6,507,061 B1 | 1/2003 | Hudgens et al. |
| 6,511,862 B1 | 1/2003 | Hudgens et al. |
| 6,511,867 B1 | 1/2003 | Lowery et al. |
| 6,512,241 B1 | 1/2003 | Lai |
| 6,514,805 B1 | 2/2003 | Xu et al. |
| 6,531,373 B1 | 3/2003 | Gill et al. |
| 6,534,781 B1 | 3/2003 | Dennison |
| 6,545,287 B1 | 4/2003 | Chiang |
| 6,545,907 B1 | 4/2003 | Lowery et al. |
| 6,555,860 B1 | 4/2003 | Lowery et al. |
| 6,563,164 B1 | 5/2003 | Lowery et al. |
| 6,566,700 B1 | 5/2003 | Xu |
| 6,567,293 B1 | 5/2003 | Lowrey et al. |
| 6,569,705 B1 | 5/2003 | Chiang et al. |
| 6,570,784 B1 | 5/2003 | Lowery |
| 6,576,921 B1 | 6/2003 | Lowery |
| 6,586,761 B1 | 7/2003 | Lowery |
| 6,589,714 B1 | 7/2003 | Maimon et al. |
| 6,590,807 B1 | 7/2003 | Lowery |
| 6,593,176 B1 | 7/2003 | Dennison |
| 6,597,009 B1 | 7/2003 | Wicker |
| 6,605,527 B1 | 8/2003 | Dennison et al. |
| 6,613,604 B1 | 9/2003 | Maimon et al. |
| 6,621,095 B1 | 9/2003 | Chiang et al. |
| 6,625,054 B1 | 9/2003 | Lowery et al. |
| 6,642,102 B1 | 11/2003 | Xu |
| 6,646,297 B1 | 11/2003 | Dennison |
| 6,649,928 B1 | 11/2003 | Dennison |
| 6,667,900 B1 | 12/2003 | Lowery et al. |
| 6,671,710 B1 | 12/2003 | Ovshinsky et al. |
| 6,673,648 B1 | 1/2004 | Lowrey |
| 6,673,700 B1 | 1/2004 | Dennison et al. |
| 6,674,115 B1 | 1/2004 | Hudgens et al. |
| 6,687,153 B1 | 2/2004 | Lowery |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |

| | | |
|---|---|---|
| 6,818,481 B1 * | 11/2004 | Moore et al. ............... 438/130 |
| 2002/0000666 A1 | 1/2002 | Kozicki et al. |
| 2002/0072188 A1 | 6/2002 | Gillon |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0132417 A1 | 9/2002 | Li |
| 2002/0160551 A1 | 10/2002 | Harshfield |
| 2002/0163828 A1 | 11/2002 | Krieger et al. |
| 2002/0168820 A1 | 11/2002 | Kozicki |
| 2002/0168852 A1 | 11/2002 | Harshfield et al. |
| 2002/0190289 A1 | 12/2002 | Harshfield et al. |
| 2002/0190350 A1 | 12/2002 | Kozicki |
| 2003/0001229 A1 | 1/2003 | Moore et al. |
| 2003/0027416 A1 | 2/2003 | Moore |
| 2003/0032254 A1 | 2/2003 | Gilton |
| 2003/0035314 A1 | 2/2003 | Kozicki |
| 2003/0035315 A1 | 2/2003 | Kozicki |
| 2003/0038301 A1 | 2/2003 | Moore |
| 2003/0043631 A1 | 3/2003 | Gilton et al. |
| 2003/0045049 A1 | 3/2003 | Campbell et al. |
| 2003/0045054 A1 | 3/2003 | Campbell et al. |
| 2003/0047765 A1 | 3/2003 | Campbell |
| 2003/0047772 A1 | 3/2003 | Li |
| 2003/0047773 A1 | 3/2003 | Li |
| 2003/0048519 A1 | 3/2003 | Kozicki |
| 2003/0048744 A1 | 3/2003 | Ovshinsky et al. |
| 2003/0049912 A1 | 3/2003 | Campbell et al. |
| 2003/0068861 A1 | 4/2003 | Li |
| 2003/0068862 A1 | 4/2003 | Li |
| 2003/0095426 A1 | 5/2003 | Hush et al. |
| 2003/0096497 A1 | 5/2003 | Moore et al. |
| 2003/0107105 A1 | 6/2003 | Kozicki |
| 2003/0117831 A1 | 6/2003 | Hush |
| 2003/0128612 A1 | 7/2003 | Moore et al. |
| 2003/0137869 A1 | 7/2003 | Kozicki |
| 2003/0143782 A1 | 7/2003 | Gilton et al. |
| 2003/0155589 A1 | 8/2003 | Campbell et al. |
| 2003/0155606 A1 | 8/2003 | Campbell et al. |
| 2003/0156447 A1 | 8/2003 | Kozicki |
| 2003/0156463 A1 | 8/2003 | Casper et al. |
| 2003/0209728 A1 | 11/2003 | Kozicki et al. |
| 2003/0209971 A1 | 11/2003 | Kozicki et al. |
| 2003/0210564 A1 | 11/2003 | Kozicki et al. |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

FOREIGN PATENT DOCUMENTS

| | | |
|---|---|---|
| WO | WO 99/28914 | 6/1999 |
| WO | WO 00/48196 | 8/2000 |
| WO | WO 02/21542 | 3/2002 |

OTHER PUBLICATIONS

PCT Application WO 00/21542, Kozicki et al., Mar. 14, 2002.*

Shimizu et al., *The Photo-Erasable Memory Switching Effect of Ag Photo-Doped Chalcogenide Glasses*, 46 B. Chem Soc. Japan, No. 12, pp. 3662-3365 (1973).

Kawamoto, Yoji And Nishida, Masaru, Ionic Conduction In $As_2S_3$—$Ag_2S$, $GeS_2$—$GeS$—$Ag_2S$ and $P_2S_5$—$Ag_2S$ Glasses, Journal of Non-Crystalline Solids 20 (1976) 393-404.

Axon Technologies Corporation, Technology Description: *Programmable Metalization Cell(PMC)*, pp. 1-6 (Pre-May 2000).

Helbert et al., *Intralevel hybrid resist process with submicron capability*, SPIE vol. 333 Submicron Lithography, pp. 24-29 (1982).

Hilt, Dissertation: *Materials characterization of Silver Chalcogenide Programmable Metalization Cells*, Arizona State University, pp. Title page-144 (UMI Company, May 1999).

Hirose et al., *High Speed Memory Behavior and Reliability of an Amorphous $As_2S_2$ Film Doped Ag*, Phys. Stat. Sol. (a) 61, pp. 87-90 (1980).

Holmquist et al., *Reaction and Diffusion in Silver-Arsenic Chalcogenide Glass Systems*, 62 J. Amer. Ceram. Soc., No. 3-4, pp. 183-188 (Mar.-Apr. 1979).

Huggett et al., *Development of silver sensitized germanium selenide photoresist by reactive* sputter etching in $SF_6$, 42 Appl. Phys. Lett., No. 7, pp. 592-594 (Apr. 1983).

Kawaguchi et al., *Mechanism of photosurface deposition*, 164-166 J. Non-Cryst. Solids, pp. 1231-1234 (1993).

Kolobov and Elliott, Photodoping of Amorphous Chalcogenides by Metals, Advances in Physics, vol. 40, No 5, 625-684 (1991).

Kozicki, et al., "Applications of Programmable Resistance Changes in Metal-doped Chalcogenides", Proceedings of the 1999 Symposium on Solid State Ionic Devices, Editors—E.D. Wachsman et al., The Electrochemical Society, Inc., 1-12 (1999).

Kozicki, et al., *Nanoscale effects in devices based on chalcogenide solid solutions*, Superlattices and Microstructures, 27, 485-488 (2000).

Kozicki, et al., *Nanoscale phase separation in Ag—Ge—Se glasses*, Microelectronic Engineering, vol. 63/1-3, 155-159 (2002).

M.N. Kozicki and M. Mitkova, *Silver incorporation in thin films of selenium rich Ge—Se glasses*, Proceedings of the XIX International Congress on Glass, Society for Glass Technology, 226-227 (2001).

McHardy et al., *The dissolution of metals in amorphous chalcogenides and the effects o electron and ultraviolet radiation*, 20 J. Phys. C.: Solid State Phys., pp. 4055-4075 (1987)*f.*

Owen et al., *Metal-Chalcogenide Photoresists for High Resolution Lithography and Sub-Micron Structures.*

Abdel-All, A.; Elshafie,A.; Elhawary, M.M., DC electric-field effect in bulk and thin-film Ge5As38Te57 chalcogenide glass, Vacuum 59 (2000) 845-853.

Adler, D.; Moss, S.C., Amorphous memories and bistable switches, J. Vac. Sci. Technol. 9 (1972) 1182-1189.

Adler, D.; Henisch, H.K.; Mott, S.N., The mechanism of threshold switching in amorphous alloys, Rev. Mod. Phys. 50 (1978) 209-220.

Afifi, M.A.; Labib, H.H.; El-Fazary, M.H.; Fadel, M., Electrical and thermal properties of chalcogenide glass system Se75Ge25-xSbx, Appl. Phys. A 55 (1992) 167-169.

Afifi,M.A.; Labib, H.H.; Fouad, S.S.; El-Shazly, A.A., Electrical & thermal conductivity of the amorphous semiconductor GexSe1−x, Egypt, J. Phys. 17 (1986) 335-342.

Alekperova, Sh.M.; Gadzhieva, G.S., Current-Voltage characteristics of Ag2Se single crystal near the phase transition, Inorganic Materials 23 (1987) 137-139.

Aleksiejunas, A.; Cesnys, A., Switching phenomenon and memory effect in thin-film heterojunction of polycrystalline selenium-silver selenide, Phys. Stat. Sol. (a) 19 (1973) K169-K171.

Angell, C.A., Mobile ions in amorphous solids, Annu. Rev. Phys. Chem. 43 (1992) 693-717.

Aniya, M., Average electronegativity, medium-range-order, and ionic conductivity in superionic glasses, Solid state Ionics 136-137 (2000) 1085-1089.

Asahara, Y.; Izumitani, T., Voltage controlled switching in Cu—As—Se compositions, J. Non-Cryst. Solids 11 (1972) 97-104.

Asokan, S.; Prasad, M.V.N.; Parthasarathy, G.; Gopal, E.S. R., Mechanical and chemical thesholds in IV-VI chalcogenide glasses, Phys. Rev. Lett. 62 (1989) 808-810.

Baranovskii, S.D.; Cordes, H., On the conduction mechanism in ionic glasses, J. Chem. Phys. 111 (1999) 7546-7557.

Belin, R.; Taillades, G.; Pradel, A.; Ribes, M., Ion dynamics in superionic chalcogenide glasses: complete conductivity spectra, Solid state Ionics 136-137 (2000) 1025-1029.

Belin, R.; Zerouale, A.; Pradel, A.; Ribes, M., Ion dynamics in the argyrodite compound Ag7GeSe5I: non-Arrhenius behavior and complete conductivity spectra, Solid State Ionics 143 (2001) 445-455.

Benmore, C.J.; Salmon, P.S., Structure of fast ion conducting and semiconducting glassy chalcogenide alloys, Phys. Rev. Lett. 73 (1994) 264-267.

Bernede, J.C., Influence du metal des electrodes sur les caracteristiques courant-tension des structures M-Ag2Se-M, Thin solid films 70 (1980) L1-L4.

Bernede, J.C., Polarized memory switching in MIS thin films, Thin Solid Films 81 (1981) 155-160.

Bernede, J.C., Switching and silver movements in Ag2Se thin films, Phys. Stat. Sol. (a) 57 (1980) K101-K104.

Bernede, J.C.; Abachi, T., Differential negative resistance in metal/insulator/metal structures with an upper bilayer electrode, Thin solid films 131 (1985) L61-L64.

Bernede, J.C.; Conan, A.; Fousenan't, E.; El Bouchairi, B.; Goureaux, G., Polarized memory switching effects In Ag2Se/Se/M thin film sandwiches, Thin solid films 97 (1982) 165-171.

Bernede, J.C.; Khelil, A.; Kettaf, M.; Conan, A., Transition from S- to N-type differential negative resistance in Al—Al2O3—Ag2-xSe1+x thin fim structures, Phys. Stat. Sol. (a) 74 (1982) 217-224.

Bondarev, V.N.; Pikhitsa, P.V., A dendrite model of current instability In RbAg4I5, Solid State Ionics 70/71 (1994) 72-76.

Boolchand, P., The maximum in glass transition temperature (Tg) near x=1/3 in GexSe1-x Glasses, Asian Journal of Physics (2000) 9, 709-72.

Boolchand, P.; Bresser, W.J., Mobile silver ions and glass formation in solid electrolytes, Nature 410 (2001) 1070-1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.

Boolchand, P.; Enzweiler, R.N.; Tenhover, M., Structural ordering of evaporated amorphous chalcogenide alloy films: role of thermal annealing, Diffusion and Defect Data vol. 53-54 (1987) 415-420.

Boolchand, P.; Grothaus, J.; Bresser, W.J.; Suranyi, P., Structural origin of broken chemical order in a GeSe2 glass, Phys. Rev. B 25 (1982) 2975-2978.

Boolchand, P.; Grothaus, J.; Phillips, J.C., Broken chemical order and phase separation in GexSe1-x glasses, Solid state comm. 45 (1983) 183-185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221-0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) 17$^{th}$ (1985) 833-36.

Bresser, W.; Boolchand, P.; Suranyi, P., Rigidity percolation and molecular clustering in network glasses, Phys. Rev. Lett. 56 (1986) 2493-2496.

Bresser, W.J.; Boolchand, P.; Suranyi, P.; de Neufville, J.P, Intrinsically broken chalcogen chemical order in stoichiometric glasses, Journal de Physique 42 (1981) C4-193-C4-196.

Bresser, W.J.; Boolchand, P.; Suranyi, P.; Hernandez, J.G., Molecular phase separation and cluster size in GeSe2 glass, Hyperfine Interactions 27 (1986) 389-392.

Cahen, D.; Gilet, J.-M.; Schmitz, C.; Chernyak, L.; Gartsman, K.; Jakubowicz, A., Room-Temperature, electric field induced creation of stable devices in CuInSe2 Crystals, Science 258 (1992) 271-274.

Chatterjee, R.; Asokan, S.; Titus, S.S.K., Current-controlled negative-resistance behavior and memory switching in bulk As—Te—Se glasses, J. Phys. D: Appl. Phys. 27 (1994) 2624-2627.

Chen, C.H.; Tai, K.L. , Whisker growth induced by Ag photodoping in glassy GexSe1-x films, Appl. Phys. Lett. 37 (1980) 1075-1077.

Chen, G.; Cheng, J., Role of nitrogen in the crystallization of silicon nitride-doped chalcogenide glasses, J. Am. Ceram. Soc. 82 (1999) 2934-2936.

Chen, G.; Cheng, J.; Chen, W., Effect of Si3N4 on chemical durability of chalcogenide glass, J. Non-Cryst. Solids 220 (1997) 249-253.

Cohen, M.H.; Neale, R.G.; Paskin, A., A model for an amorphous semiconductor memory device, J. Non-Cryst. Solids 8-10 (1972) 885-891.

Croitoru, N.; Lazarescu, M.; Popescu, C.; Telnic, M.; and Vescan, L., Ohmic and non-ohmic conduction in some amorphous semiconductors, J. Non-Cryst. Solids 8-10 (1972) 781-786.

Dalven, R.; Gill, R., Electrical properties of beta-Ag2Te and beta-Ag2Se from 4.2 to 300K, J. Appl. Phys. 38 (1967) 753-756.

Davis, E.A., Semiconductors without form, Search 1 (1970) 152-155.

Deamaley, G.; Stoneham, A.M.; Morgan, D.V., Electrical phenomena in amorphous oxide films, Rep. Prog. Phys. 33 (1970) 1129-1191.

Dejus, R.J.; Susman, S.; Volin, K.J.; Montague, D.G.; Price, D.L., Structure of Vitreous Ag—Ge—Se, J. Non-Cryst. Solids 143 (1992) 162-180.

den Boer, W., Threshold switching in hydrogenated amorphous silicon, Appl. Phys. Lett. 40 (1982) 812-813.

Drusedau, T.P.; Panckow, A.N.; Klabunde, F., The hydrogenated amorphous silicon/nanodisperse metal (SIMAL) system-Films of unique electronic properties, J. Non-Cryst. Solids 198-200 (1996) 829-832.

El Bouchairi, B.; Bernede, J.C.; Burgaud, P., Properties of Ag2−xSe1+x/n−Si diodes, Thin Solid Films 110 (1983) 107-113.

El Gharras, Z.; Bourahla, A.; Vautier, C., Role of photoinduced defects in amorphous GexSe1−x photoconductivity, J. Non-Cryst. Solids 155 (1993) 171-179.

El Ghrandi, R.; Calas, J.; Galibert, G.; Averous, M., Silver photodissolution in amorphous chalcogenide thin films, Thin Solid Films 218 (1992)259-273.

El Ghrandi, R.; Calas, J.; Galibert, G., Ag dissolution kinetics in amorphous GeSe5.5 thin films from "in-situ" resistance measurements vs time, Phys. Stat. Sol. (a) 123 (1991) 451-460.

El-kady, Y.L., The threshold switching in semiconducting glass Ge21Se17Te62, Indian J. Phys. 70A (1996) 507-516.

Elliot, S.R., A unified mechanism for metal photodissolution in amorphous chalcogenide materials, J. Non-Cryst. Solids 130 (1991) 85-97.

Elliot, S.R., Photodissolution of metals in chalcogenide glasses: A unified mechanism, J. Non-Cryst. Solids 137-138 (1991) 1031-1034.

Elsamanoudy, M.M.; Hegab, N.A.; Fadel, M., Conduction mechanism in the pre-switching state of thin films containing Te As Ge Si, Vacuum 46 (1995) 701-707.

El-Zahed, H.; El-Korashy, A., Influence of composition on the electrical and optical properties of Ge20BixSe80−x films, Thin Solid Films 376 (2000) 236-240.

Fadel, M., Switching phenomenon in evaporated Se—Ge—As thin films of amorphous chalcogenide glass, Vacuum 44 (1993) 851-855.

Fadel, M.; El-Shair, H.T., Electrical, thermal and optical properties of Se75Ge7Sb18, Vacuum 43 (1992) 253-257.

Feng, X. ;Bresser, W.J.; Boolchand, P., Direct evidence for stiffness theshold in Chalcogenide glasses, Phys. Rev. Lett. 78 (1997) 4422-4425.

Feng, X.; Bresser, W.J.; Zhang, M.; Goodman, B.; Boolchand, P., Role of network connectivity on the elastic, plastic and thermal behavior of covalent glasses, J. Non-Cryst. Solids 222 (1997) 137-143.

Fischer-Colbrie, A.; Bienenstock, A.; Fuoss, P.H.; Marcus, M.A., Structure and bonding in photodiffused amorphous Ag—GeSe2 thin films, Phys. Rev. B 38 (1988) 12388-12403.

Fleury, G.; Hamou, A.; Viger, C.; Vautier, C., Conductivity and crystallization of amorphous selenium, Phys. Stat. Sol. (a) 64 (1981) 311-316.

Fritzsche, H, Optical and electrical energy gaps in amorphous semiconductors, J. Non-Cryst. Solids 6 (1971) 49-71.

Fritzsche, H., Electronic phenomena in amorphous semiconductors, Annual Review of Materials Science 2 (1972) 697-744.

Gates, B.; Wu, Y.; Yin, Y.; Yang, P.; Xia, Y., Single-crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013-1018.

Guin, J.-P.; Rouxel, T.; Keryvin, V.; Sangleboeuf, J.-C.; Serre, I.; Lucas, J., Indentation creep of Ge—Se chalcogenide glasses below Tg: elastic recovery and non-Newtonian flow, J. Non-Cryst. Solids 298 (2002) 260-269.

Guin, J.-P.; Rouxel, T.; Sangleboeuf, J.-C.; Melscoet, I.; Lucas, J., Hardness, toughness, and scratchability of germanium-selenium chalcogenide glasses, J. Am. Ceram. Soc. 85 (2002) 1545-52.

Gupta, Y.P., On electrical switching and memory effects in amorphous chalcogenides, J. Non-Cryst. Sol. 3 (1970) 148-154.

Haberland, D.R.; Stiegler, H., New experiments on the charge-controlled switching effect in amorphous semiconductors, J. Non-Cryst. Solids 8-10 (1972) 408-414.

Haifz, M.M.; Ibrahim, M.M.; Dongol, M.; Hammad, F.H., Effect of composition on the structure and electrical properties of As—Se—Cu glasses, J. Apply. Phys. 54 (1983) 1950-1954.

Hajto, J.; Rose, M.J.; Osbome, I.S.; Snell, A.J.; Le Comber, P.G.; Owen, A.E., Quantization effects in metal/a-Si:H/metal devices, Int. J. Electronics 73 (1992) 911-913.

Hajto, J.; Hu, J.; Snell, A.J.; Turvey, K.; Rose, M., DC and AC measurements on metal/a-Si:H/metal room temperature quantised resistance devices, J. Non-Cryst. Solids 266-269 (2000) 1058-1061.

Hajto, J.; McAuley, B.; Snell, A.J.; Owen, A.E., Theory of room temperature quantized resistance effects in metal-a-Si:H-metal thin film structures, J. Non-Cryst. Solids 198-200 (1996) 825-828.

Hajto, J.; Owen, A.E.; Snell, A.J.; Le Comber, P.G.; Rose, M.J., Analogue memory and ballistic electron effects in metal-amorphous silicon structures, Phil. Mag. B 63 (1991) 349-369.

Hayashi, T.; Ono, Y.; Fukaya, M.; Kan, H., Polarized memory switching in amorphous Se film, Japan. J. Appl. Phys. 13 (1974) 1163-1164.

Hegab, N.A.; Fadel, M.; Sedeek, K., Memory swithing phenomena in thin films of chalcogenide semiconductors, Vacuum 45 (1994) 459-462.

Hirose, Y.; Hirose, H., Polarity-dependent memory switching and behavior of Ag dendrite in Ag-photodoped amorphous As2S3 films, J. Appl. Phys. 47 (1976) 2767-2772.

Hong, K.S.; Speyer, R.F., Switching behavior in II-IV-V2 amorphous semiconductor sytems, J. Non-Cryst. Solids 116 (1990) 191-200.

Hosokawa, S., Atomic and electronic structures of glassy GexSe1−x around the stiffness theshold composition, J. Optoelectronics and Advanced Materials 3 (2001) 199-214.

Hu, J.; Snell, A.J.; Hajto, J.; Owen, A.E., Constant current forming in Cr/p+a−/Si:H/V thin film devices, J. Non-Cryst. Solids 227-230 (1998) 1187-1191.

Hu, J.; Hajto,J.; Snell, A.J.; Owen, A.E.; Rose, M.J., Capacitance anomaly near the metal-non-metal transition in Cr-hydrogenated amorphous Si—V thin-film devices, Phil. Mag. B. 74 (1996) 37-50.

Hu, J.; Snell, A.J.; Hajto, J.; Owen, A.E., Current-Induced Instability In Cr−p+a−Si:H−V thin film devices, Phil. Mag. B 80 (2000) 29-43.

Iizima, S.; Sugi, M.; Kikuchi M.; Tanaka, K., Electrical and thermal properties of semiconducting glasses As—Te—Ge, Solid State Comm. 8 (1970) 153-155.

Ishikawa, R.; Kikuchi, M., Photovoltaic study on the photo-enhanced diffusion of Ag in amorphous fims of Ge2S3, J. Non-Cryst. Solids 35 & 36 (1980) 1061-1066.

Iyetomi, H.; Vashishta, P.; Kalia, R.K., Incipient phase separation in Ag/Ge/Se glasses: clustering of Ag atoms, J. Non-Cryst. Solids 262 (2000) 135-142.

Jones, G.; Collins, R.A., Switching properties of thin selenium films under pulsed bias, Thin Solid Films 40 (1977) L15-L18.

Joullie, A.M.; Marucchi, J., On the DC electrical conduction of amorphous As2Se7 before swithing, Phys. Stat. Sol. (a) 13 (1972) K105-K109.

Joullie, A.M.; Marucchi, J., Electrical properties of the amorphous alloy As2Se5, Mat. Res. Bull. 8 (1973) 433-442.

Kaplan, T.; Adler, D., Electrothermal switching in amorphous semiconductors, J. Non-Cryst. Solids 8-10 (1972) 538-543.

Kawaguchi, T.; Maruno, S.; Elliott, S.R., Optical, electrical, and structural properties of amorphous Ag—Ge—S and Ag—Ge—Se films and comparison of photoinduced and thermally induced phenomena of both systems, J. Appl. Phys. 79 (1996) 9096-9104.

Kawaguchi, T.; Masul, K., Analysis of change in optical transmission spectra resulting from Ag photodoping in chalcogenide film, Japn. J. Appl. Phys. 26 (1987) 15-21.

Kawasaki, M.; Kawamura, J.; Nakamura, Y.; Aniya, M., Ionic conductivity of Agx(GeSe3)1−x (0<=x<=0.571) glasses, Solid state Ionics 123 (1999) 259-269.

Kluge, G.; Thomas, A.; Klabes, R.; Grotzschel, R., Silver photodiffusion in amorphous GexSe100−x, J. Non-Cryst. Solids 124 (1990) 186-193.

Kolobov, A.V., On the origin of p-type conductivity in amorphous chalcogenides, J. Non-Cryst. Solids 198-200 (1996) 728-731.

Kolobov, A.V., Lateral diffusion of silver in vitreous chalcogenide films, J. Non-Cryst. Solids 137-138 (1991) 1027-1030.

Korkinova, Ts.N.; Andreichin,R.E., Chalcogenide glass polarization and the type of contacts, J. Non-Cryst. Solids 194 (1996) 256-259.

Kotkata, M.F.; Afif, M.A.; Labib, H.H.; Hebab, N.A.; Abdel-Aziz, M.M., Memory switching in amorphous GeSeTi chalcogenide semiconductor films, Thin Solid Films 240 (1994) 143-146.

Lakshminarayan, K.N.; Srivastava, K.K.; Panwar, O.S.; Dunmar, A., Amorhous semiconductor devices: memory and swithing mechanism, J. Instn Electronics & Telecom. Engrs 27 (1981) 16-19.

Lal, M.; Goyal, N., Chemical bond approach to study the memory and thershold swithing chalcogenide glasses, Indian Jornal of pure & appl. phys. 29 (1991) 303-304.

Leimer, F.; Stotzel, H.; Kottwitz, A., Isothermal electrical polarization of amorphous GeSe films with blocking Al contacts influenced by Poole-Frenkel conduction, Phys. Stat. Sol. (a) 29 (1975) K129-K132.

Leung, W.; Cheung, N.; Neureuther, A.R., Photoinduced diffusion of Ag in GexSe1−x glass, Appl. Phys. Lett. 46 (1985) 543-545.

Matsushita, T.; Yamagami, T.; Okuda, M., Polarized memory effect observed on Se—SnO2 system, Jap. J. Appl. Phys. 11 (1972) 1657-1662.

Matsushita, T.; Yamagami, T.; Okuda, M., Polarized memory effect observed on amorphous selenium thin films, Jpn. J. Appl. Phys. 11 (1972) 606.

Mazurier, F.; Levy M.; Souquet, J.L, Reversible and irreversible electrical switching in TeO2—V2O5 based glasses, Journal de Physique IV 2 (1992) C2-185-C2-188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253-258.

Mitkova, M.; Boolchand, P., Microscopic origin of the glass forming tendency in chalcogenides and constraint theory, J. Non-Cryst. Solids 240 (1998) 1-21.

Mitkova, M.; Kozicki, M.N., Silver incorporation in Ge—Se glasses used in programmable metallization cell devices, J. Non-Cryst. Solids 299-302 (2002) 1023-1027.

Mitkova, M.; Wang, Y.; Boolchand, P., Dual chemical role of Ag as an additive in chalcogenide glasses, Phys. Rev. Lett. 83 (1999) 3848-3851.

Miyatani, S.-y., Electronic and ionic conduction in (AgxCu1−x)2Se, J. Phys. Soc. Japan 34 (1973) 423-432.

Miyatani, S.-y., Electrical properties of Ag2Se, J. Phys. Soc. Japan 13 (1958) 317.

Miyatani, S.-y., Ionic conduction in beta-Ag2Te and beta-Ag2Se, Journal Phys. Soc. Japan 14 (1959) 996-1002.

Mott, N.F., Conduction in glasses containing transition metal ions, J. Non-Cryst. Solids 1 (1968) 1-17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564-569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157-6161.

Nang, T.T.; Okuda, M.; Matsushita, T.; Yokota, S.; Suzuki, A., Electrical and optical parameters of GexSe1−x amorphous thin films, Jap. J. App. Phys. 15 (1976) 849-853.

Narayanan, R.A.; Asokan, S.; Kumar, A., Evidence concerning the effect of topology on electrical switching in chalcogenide network glasses, Phys. Rev. B 54 (1996) 4413-4415.

Neale, R.G.; Aseltine, J.A., The application of amorphous materials to computer memories, IEEE transactions on electron dev. Ed-20 (1973) 195-209.

Ovshinsky S.R.; Fritzsche, H., Reversible structural transformations in amorphous semiconductors for memory and logic, Mettalurgical transactions 2 (1971) 641-645.

Ovshinsky, S.R., Reversible electrical switching phenomena in disordered structures, Phys. Rev. Lett. 21 (1968) 1450-1453.

Owen, A.E.; LeComber, P.G.; Sarrabayrouse, G.; Spear, W.E., New amorphous-silicon electrically programmamble nonvolatile switching device, IEE Proc. 129 (1982) 51-54.

Owen, A.E.; Firth, A.P.; Ewen, P.J.S., Photo-induced structural and physico-chemical changes in amorphous chalcogenide semiconductors, Phil. Mag. B 52 (1985) 347-362.

Owen, A.E.; Le Comber, P.G.; Hajto, J.; Rose, M.J.; Snell, A.J., Switching in amorphous devices, Int. J. Electronics 73 (1992) 897-906.

Pearson, A.D.; Miller, C.E., Filamentary conduction in semiconducting glass diodes, App. Phys. Lett. 14 (1969) 280-282.

Pinto, R.; Ramanathan, K.V., Electric field induced memory swithing in thin films of the chalcogenide system Ge—As—Se, Appl. Phys. Lett. 19 (1971) 221-223.

Popescu, C., The effect of local non-uniformities on thermal swithing and high field behavior of structures with chalcogenide glasses, Solid-state electronics 18 (1975) 671-681.

Popescu, C.; Croitoru, N., The contribution of the lateral thermal instability to the switching phenomenon, J. Non-Cryst. Solids 8-10 (1972) 531-537.

Popov, A.I.; Geller, I.KH.; Shemetova, V.K., Memory and threshold switching effects in amorphous selenium, Phys. Stat. Sol. (a) 44 (1977) K71-K73.

Prakash, S.; Asokan, S.; Ghare, D.B., Easily reversible memory switching in Ge—As—Te glasses, J. Phys. D: Appl. Phys. 29 (1996) 2004-2008.

Rahman, S.; Sivarama Sastry, G., Electronic switching in Ge—Bi—Se—Te glasses, Mat. Sci. and Eng. B12 (1992) 219-222.

Ramesh, K.; Asokan, S.; Sangunni, K.S.; Gopal, E.S.R., Electrical Switching in germanium telluride glasses doped with Cu and Ag, Appl. Phys. A 69 (1999) 421-425.

Rose,M.J.;Hajto,J.;Lecomber,P.G.;Gage,S.M.;Choi,W.K.; Snell,A.J.;Owen,A.E., Amorphous silicon analogue memory devices, J. Non-Cryst. Solids 115 (1989) 168-170.

Rose,M.J.;Snell,A.J.;Lecomber,P.G.;Hajto,J.;Fitzgerald,A. G.;Owen,A.E., Aspects of non-volatility in a -Si:H memory devices, Mat. Res. Soc. Symp. Proc. V 258, 1992, 1075-1080.

Schuocker, D.; Rieder, G., On the reliability of amorphous chalcogenide switching devices, J. Non-Cryst. Solids 29 (1978) 397-407.

Sharma, A.K.; Singh, B., Electrical conductivity measurements of evaporated selenium films in vacuum, Proc. Indian Natn. Sci. Acad. 46, A, (1980) 362-368.

Sharma, P., Structural, electrical and optical properties of silver selenide films, Ind. J. Of pure and applied phys. 35 (1997) 424-427.

Snell, A.J.; Lecomber, P.G.; Hajto, J.; Rose, M.J.; Owen, A.E.; Osborne, I.L., Analogue memory effects in metal/a-Si:H/metal memory devices, J. Non-Cryst. Solids 137-138 (1991) 1257-1262.

Snell, A.J.; Hajto, J.;Rose, M.J.; Osborne, L.S.; Holmes, A.; Owen, A.E.; Gibson, R.A.G., Analogue memory effects in metal/a-Si:H/metal thin film structures, Mat. Res. Soc. Symp. Proc. V 297, 1993, 1017-1021.

Steventon, A.G., Microfilaments in amorphous chalcogenide memory devices, J. Phys. D: Appl. Phys. 8 (1975) L120-L122.

Steventon, A.G., The switching mechanisms in amorphous chalcogenide memory devices, J. Non-Cryst. Solids 21 (1976) 319-329.

Stocker, H.J., Bulk and thin film switching and memory effects in semiconducting chalcogenide glasses, App. Phys. Lett. 15 (1969) 55-57.

Tanaka, K., Ionic and mixed conductions in Ag photodoping process, Mod. Phys. Lett B 4 (1990) 1373-1377.

Tanaka, K.; Iizima, S.; Sugi, M.; Okada, Y.; Kikuchi, M.; Thermal effects on switching phenomenon in chalcogenide amorphous semiconductors, Solid State Comm. 8 (1970) 387-389.

Thornburg, D.D., Memory switching in a Type I amorphous chalcogenide, J. Elect. Mat. 2 (1973) 3-15.

Thornburg, D.D., Memory switching in amorphous arsenic triselenide, J. Non-Cryst. Solids 11 (1972) 113-120.

Thornburg, D.D.; White, R.M., Electric Field enhanced phase separation and memory switching in amorphous arsenic triselenide, Journal(??) (1972) 4609-4612.

Tichy, L.; Ticha, H., Remark on the glass-forming ability in GexSe1−x and AsxSe1−x systems, J. Non-Cryst. Solids 261 (2000) 277-281.

Titus, S.S.K.; Chatterjee, R.; Asokan, S., Electrical switching and short-range order in As—Te glasses, Phys. Rev. B 48 (1993) 14650-14652.

Tranchant,S.;Peytavin,S.;Ribes,M.;Flank,A.M.;Dexpert,H.; Lagarde,J.P., Silver chalcogenide glasses Ag—Ge—Se: Ionic conduction and exafs structural investigation, Transport-structure relations in fast ion and mixed conductors Proceedings of the 6th Riso International symposium. Sep. 9-13, 1985.

Tregouet, Y.; Bernede, J.C., Silver movements in Ag2Te thin films: switching and memory effects, Thin Solid Films 57 (1979) 49-54.

Uemura, O.; Kameda, Y.; Kokai, S.; Satow, T., Thermally induced crystallization of amorphous Ge0.4Se0.6, J. Non-Cryst. Solids 117-118 (1990) 219-221.

Uttecht, R.; Stevenson, H.; Sie, C.H.; Griener, J.D.; Raghavan, K.S., Electric field induced filament formation in As—Te—Ge glass, J. Non-Cryst. Solids 2 (1970) 358-370.

Viger, C.; Lefrancois, G.; Fleury, G., Anomalous behaviour of amorphous selenium films, J. Non-Cryst. Solids 33 (1976) 267-272.

Vodenicharov, C.; Parvanov,S.; Petkov,P., Electrode-limited currents in the thin-film M-GeSe-M system, Mat. Chem. And Phys. 21 (1989) 447-454.

Wang, S.-J.; Misium, G.R.; Camp, J.C.; Chen, K.-L.; Tigelaar, H.L., High-performance Metal/silicide antifuse, IEEE electron dev. Lett. 13 (1992)471-472.

Weirauch, D.F., Threshold switching and themal filaments in amorphous semiconductors, App. Phys. Lett. 16 (1970) 72-73.

West, W.C.; Sieradzki, K.; Kardynal, B.; Kozicki, M.N., Equivalent circuit modeling of the Ag|As0.24S0.36Ag0. 40|Ag System prepared by photodissolution of Ag, J. Electrochem. Soc. 145 (1998) 2971-2974.

West, W.C., Electrically erasable non-volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non-Cryst. Solids 151 (1992) 149-154.

* cited by examiner

METHOD OF MANUFACTURE OF A RESISTANCE VARIABLE MEMORY CELL

FIELD OF THE INVENTION

The invention relates to the field of random access memory (RAM) devices formed using a resistance variable material, and in particular to an improved method of manufacturing a resistance variable memory element.

BACKGROUND OF THE INVENTION

A well known semiconductor memory component is a random access memory (RAM). RAM permits repeated read and write operations on memory elements. Typically, RAM devices are volatile, in that stored data is lost once the power source is disconnected or removed. Non-limiting examples of RAM devices include dynamic random access memory (DRAM), synchronized dynamic random access memory (SDRAM) and static random access memory (SRAM). In addition, DRAMS and SDRAMS also typically store data in capacitors which require periodic refreshing to maintain the stored data.

Recently resistance variable memory elements, which include programmable conductor memory elements, have been investigated for suitability as semi-volatile and non-volatile random access memory elements. Generally a programmable conductor memory element includes an insulating dielectric material formed of a chalcogenide glass disposed between two electrodes. A conductive material, such as silver, is incorporated into the dielectric material. The resistance of the dielectric material can be changed between high resistance and low resistance states. The programmable conductor memory is normally in a high resistance state when at rest. A write operation to a low resistance state is performed by applying a voltage potential across the two electrodes.

When set in a low resistance state, the state of the memory element will remain intact for minutes or longer after the voltage potentials are removed. Such material can be returned to its high resistance state by applying a reverse voltage potential between the electrodes as used to write the element to the low resistance state. Again, the highly resistive state is maintained once the voltage potential is removed. This way, such a device can function, for example, as a resistance variable memory element having two resistance states, which can define two logic states.

One preferred resistance variable material comprises a chalcogenide glass, for example, a $Ge_xSe_{100-x}$ glass. One method of forming a resistance variable memory element based on chalcogenide glass includes forming a lower electrode over a substrate, forming an insulating layer over the lower electrode, forming an opening in the insulating layer to expose the lower electrode, forming a metal containing chalcogenide glass in the opening, recessing the metal containing chalcogenide glass, and forming an upper electrode overlying the insulating layer and the recessed metal containing chalcogenide glass. The resistance variable memory element can be recessed using a dry etch or plasma etch. The chemistries used in the dry etch or plasma etch produce inherent sidewalls of chemical compounds on the photo resist or structure used to define the etch which are very difficult to remove.

A specific example of a metal containing chalcogenide glass is germanium-selenide ($Ge_xSe_{100-x}$) containing silver (Ag). A method of providing silver to the germanium-selenide composition is to initially form a germanium-selenide glass and then deposit a thin layer of silver upon the glass, for example by sputtering, physical vapor deposition, or other known technique in the art. The layer of silver may be irradiated, preferably with electromagnetic energy at a wavelength less than 600 nanometers, so that the energy passes through the silver and to the silver/glass interface, to break a chalcogenide bond of the chalcogenide material such that the glass is doped with silver. Silver may also be provided to the glass by processing the glass with silver, as in the case of a silver-germanium-selenide glass. Another method for providing metal to the glass is to provide a layer of silver-selenide on a germanium-selenide glass.

It would be desirable to have an improved method of fabricating a resistance variable memory element, which does not produce undesirable etch chemistry sidewalls.

BRIEF SUMMARY OF THE INVENTION

The present invention provides a method of fabricating a resistance variable memory element which inhibits production of undesirable etch chemistry sidewalls. In a first embodiment, the method includes forming an insulating layer over a first electrode; forming an opening in the insulating layer to expose a portion of the first electrode; forming a metal material in the opening; depositing a resistance variable material over the metal material and in the opening; processing the resistance variable material to diffuse metal ions from the metal material into the resistance variable material to form a metal containing resistance variable material in the opening; and forming a second electrode over the insulating layer and over the metal containing resistance variable material.

The metal material is preferably silver, the resistance variable material is preferably a germanium-selenium composition, and the resulting metal containing resistance variable material is preferably a silver-germanium-selenium composition.

In another embodiment a metal-chalcogenide layer, for example, silver selenide is formed over the metal material and a second resistance variable material, for example a second germanium-selenium composition, is formed over the metal-chalcogenide layer, prior to the formation of the second electrode.

These and other features and advantages of the invention will be more apparent from the following detailed description, which is provided in connection with the accompanying drawings and illustrate exemplary embodiments of the invention.

DETAILED DESCRIPTION OF THE INVENTION

In the following detailed description, reference is made to various specific structural and process embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a plastic or a semiconductor substrate that has an exposed substrate surface. Semiconductor substrates should be understood to include silicon, silicon-on-insulator (SOI), silicon-on-sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The term "silver" is intended to include not only elemental silver, but silver with other trace metals or in various alloyed combinations with other metals as known in the semiconductor industry, as long as such silver alloy is conductive, and as long as the physical and electrical properties of the silver remain unchanged.

The term "silver-selenide" is intended to include various species of silver-selenide, including some species which have a slight excess or deficit of silver, for instance, $Ag_2Se$, $Ag_{2+x}Se$, and $Ag_{2-x}Se$.

The term "semi-volatile memory device" is intended to include any memory device which is capable of maintaining its memory state after power is removed from the device for a prolonged period of time. Thus, semi-volatile memory devices are capable of retaining stored data after the power source is disconnected or removed. The term "semi-volatile memory device" as used herein includes not only semi-volatile memory devices, but also non-volatile memory devices.

The term "resistance variable memory element" is intended to include any memory element, including programmable conductor memory elements, semi-volatile memory elements, and non-volatile memory elements which exhibit a resistance change in response to an applied voltage.

The present invention relates to a process for forming a resistance variable memory element. The invention will now be explained with reference to FIGS. 1–10, which illustrate exemplary embodiments of a resistance variable memory element 100 in accordance with the invention. FIG. 10 shows an exemplary processing sequence for forming a resistance variable memory element in an exemplary embodiment of the invention.

Figure 1:
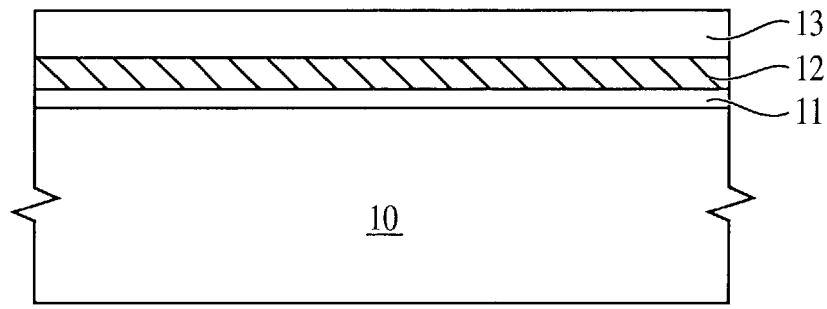
FIG. 1 is a cross-sectional view depicting a semiconductor substrate at an initial stage of processing towards a resistance variable memory element.

Referring to FIGS. 1 and 10, a semiconductor substrate 10, such as a silicon wafer, is prepared for the processing steps of the present invention. A resistance variable memory element may be implemented in various different technologies. One such application is in memory devices. Insulating material 11, such as silicon dioxide, is formed over substrate 10 in process segment 108. Next and as shown at process segment 110, a first electrode 12, is formed over the insulating material 11. The material used to form the electrode can be selected from a variety of conductive materials, for example, tungsten, nickel, tantalum, titanium, titanium nitride, aluminum, platinum, or silver, among many others. Next and as shown at process segment 120, an insulating layer 13, preferably formed of silicon nitride, is formed over the first electrode 12. This and any other subsequently formed insulating layers may be formed of a conventional insulating nitride or oxide, among others. The present invention is not limited, however, to the above-listed materials and other insulating and/or dielectric materials known in the industry may be used. The insulating layer may be formed by any known deposition methods, for example, by sputtering, chemical vapor deposition (CVD), plasma enhanced CVD (PECVD) or physical vapor deposition (PVD), among others.

Figure 2:
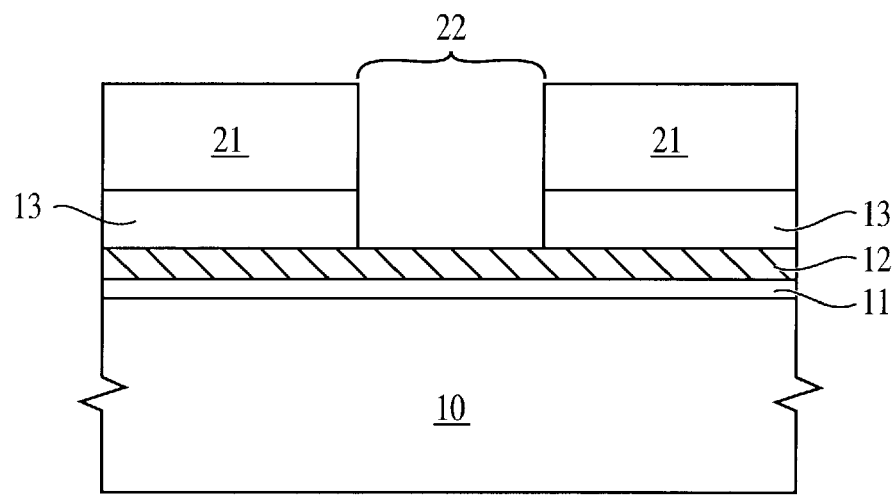
FIG. 2 is a subsequent cross-sectional view taken from FIG. 1 at a stage of processing subsequent to that shown in FIG. 1.

Referring now to FIG. 2 and processing segment 130 of FIG. 10, the insulating layer 13 is etched to form an opening 22, which exposes the first electrode 12. This is done by patterning a masking material 21 and etching to remove unmasked portions of the insulating layer 13, with the etch stopping once it reaches the first electrode 12.

Figure 3:
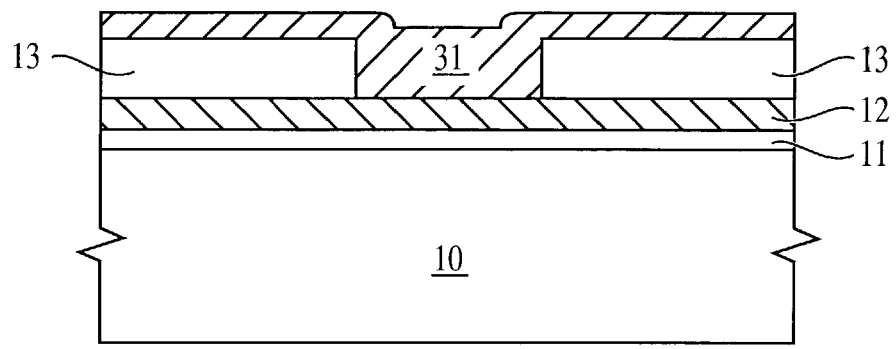
FIG. 3 is a subsequent cross-sectional view taken from FIG. 2 at a stage of processing subsequent to that shown in FIG. 2.

Referring now to FIG. 3 and processing segment 140, the masking material 21 of FIG. 2 is stripped and a metal containing layer 31, such as silver is formed to substantially fill the opening 22 and contact the first electrode 12. Silver-selenide may also be used as the metal containing layer 31.

Figure 4:
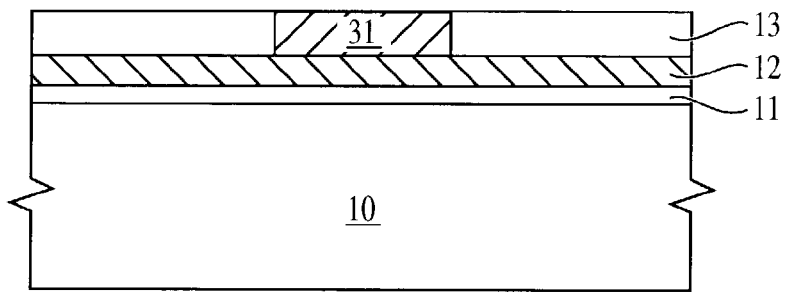
FIG. 4 is a subsequent cross-sectional view taken from FIG. 3 at a stage of processing subsequent to that shown in FIG. 3.

Referring now to FIG. 4 and processing segment 150 of FIG. 10, the metal containing layer 31 is then planarized down to expose the surface of insulating layer 13, by using an abrasive planarization etching technique, such as chemical mechanical planarization (CMP). Thus, the metal containing layer 31 is left only in the opening 22.

Figure 5:
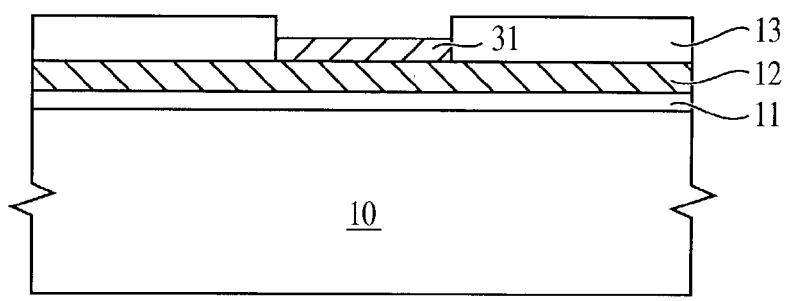
FIG. 5 is a subsequent cross-sectional view taken from FIG. 4 at a stage of processing subsequent to that shown in FIG. 4.

Referring now to FIG. 5 and processing segment 160 of FIG. 10, a partial etchback, preferably a wet etch, is performed to remove a portion of the metal containing layer from the opening 22. An exemplary wet etch would incorporate $HNO_3$ and $H_2O$. Regardless of the type of etch used, it is desirable that the metal containing layer 31 is recessed within the opening 22 approximately 50% or less of the depth of opening 22 and preferably is recessed by about 40 to about 50% of the depth, the importance of which will become apparent later in the description of the process. Wet etching is preferred to alleviate the problem of a sidewall forming from etch chemicals. Also, as wet etching is performed down an opening, the isotropic nature of wet etching is not a constraint and the etching is self-aligned to the opening.

Figure 6:
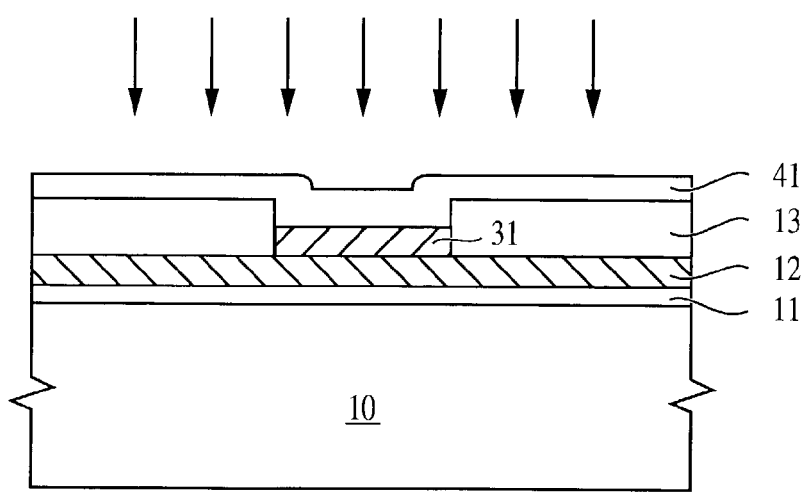
FIG. 6 is a subsequent cross-sectional view taken from FIG. 5 at a stage of processing subsequent to that shown in FIG. 5.

Referring now to FIG. 6 and processing segments 170 and 180, a first resistance variable material 41 is formed over the insulating layer 13 and recessed metal containing layer 31. The first resistance variable material 41 is deposited in such a manner so as to contact the recessed metal containing layer 31. In an exemplary embodiment, the first resistance variable material 41 is a chalcogenide glass and is preferably a germanium-selenide glass. The germanium-selenide glass composition is preferably one having a $Ge_xSe_{100-x}$ stoichiometry of from about $Ge_{20}Se_{80}$ to about $Ge_{33}Se_{67}$, and is more preferably about $Ge_{25}Se_{75}$. The first resistance variable material 41 may be deposited by any known deposition methods, for example, by sputtering, chemical vapor deposition (CVD), plasma enhanced CVD (PECVD) or physical vapor deposition (PVD).

In accordance with processing segment 180 shown in FIG. 10, and as indicated by arrows in FIG. 6, the substrate 10 is either irradiated with light or thermally treated in combination with light irradiation to cause sufficient diffusion of metal ions from recessed metal containing layer 31 into the first resistance variable material 41. For example, the first resistance variable material 41 may be irradiated for about 5 to 30 minutes at between about 1 $mW/cm^2$ to about 10 $mW/cm^2$ with light at from about 200 nm to about 600 nm wavelength. Additionally, the irradiation may be used in combination with a thermal process using a temperature of from about 50° C. to about 300° C. (depending upon the glass stoichiometry) and preferably about 110° C. for about 5 to about 15 minutes and preferably 10 minutes. The irradiation process is sufficient to cause the desired diffusion of metal ions from metal containing layer 31 into layer 41; however, the thermal process by itself is not used, but is only used in combination with the irradiation process.

Because of the confinement of the metal containing layer 31, metal ions are only incorporated into the resistance variable material within the opening 22. By recessing the metal containing layer 31 within the opening 22 by about 40% to about 50% in processing segment 160, a sufficient amount of the metal containing layer 31 is available for diffusion of metal ions into the resistance variable material 41.

Figure 7:
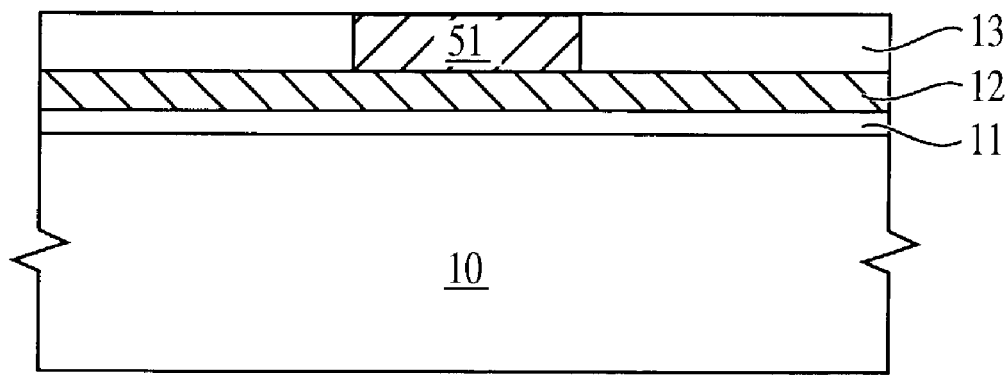
FIG. 7 is a subsequent cross-sectional view taken from FIG. 6 at a stage of processing subsequent to that shown in FIG. 6.

Referring now to FIG. 7, processing the substrate with light irradiation, results in a metal containing resistance variable material 51 being formed in the opening 22. Any residual resistance variable material over layer 13 is removed by a dry etch process in processing segment 190 shown in FIG. 10. By removing the residual resistance variable material, further metal doping of the memory element will not occur during subsequent processing and volume expansion stress is reduced. The dry etch process is preferably a chemistry containing a gas which is selective between the resistance variable material 41 and the metal containing resistance variable material 51. For example, an exemplary selective dry etch process would include $CF_4$ gas and/or $SF_6$ gas which are selective between $Ge_{25}Se_{75}$ and $Ag_x(Ge_{25}Se_{75})_{1-x}$. If, by chance, metal is doped into the resistance variable material above or to the side of the opening 22, the dry etch will not remove it, however, the stress of confining the doped area of the element is relieved through the top of the element resulting in an element that is mushroom shaped at the top of the opening 22. However, the mushroom shape is not a detriment to electrical performance.

Figure 8:
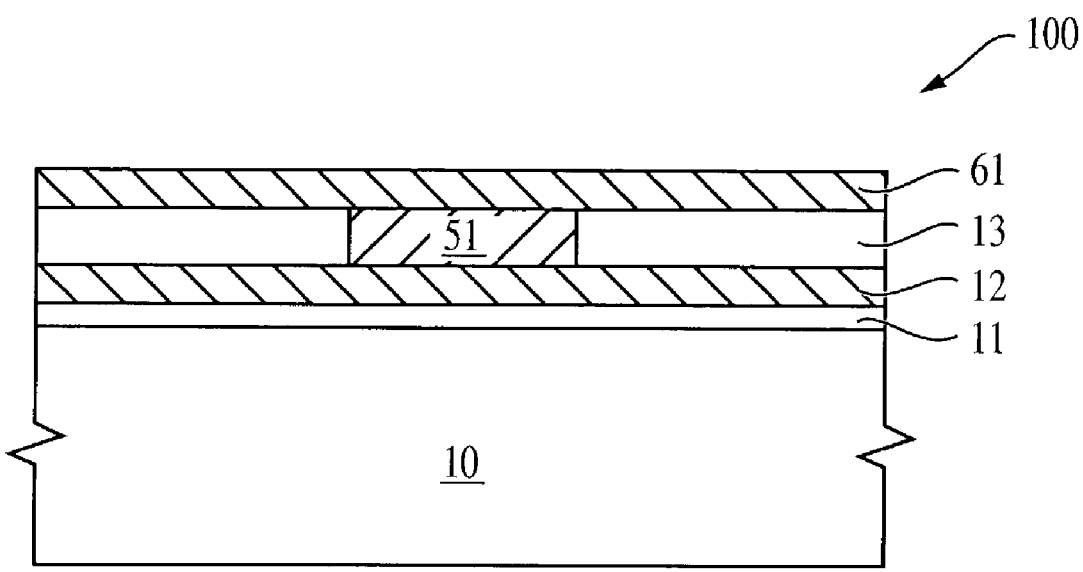
FIG. 8 is a subsequent cross-sectional view taken from FIG. 7 at a stage of processing subsequent to that shown in FIG. 7.
Figure 9A:
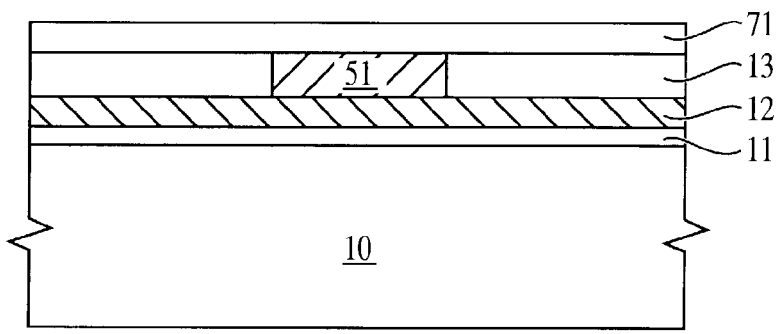
FIG. 9A is a subsequent cross-sectional view taken from FIG. 7 at a stage of processing subsequent to that shown in FIG. 7 in accordance with a second embodiment of the invention.

Referring now to FIG. 8 and processing segment 200, a second conductive electrode 61 is formed over the insulating layer 13 and metal containing resistance variable material 51 to complete the formation of the resistance variable memory element. The second electrode is preferably formed of tungsten, however any suitable conductive materials may be used to form the second electrode 61. The resulting structure forms a resistance variable memory element comprising a metal containing resistance variable material (i.e., such as a silver containing chalcogenide glass layer) and at least two conductive electrodes, namely electrodes 12 and 61. Conventional processing steps can then be carried out to electrically couple the second electrode 61 to various circuits of memory arrays.

FIGS. 1–8 depict a first exemplary embodiment of the invention. The structure depicted in FIG. 7 can also form the base of a second embodiment of the invention. The second embodiment is now described with reference to FIGS. 9A–9C and process segments 300–320 of FIG. 10. As shown in FIG. 9A and process segment 300 of FIG. 10 a metal containing layer 71, such as silver-selenide, may be deposited over the metal containing resistance variable material 51. Any suitable metal containing layer 71 may be used. For instance, other suitable metal containing layers include silver-chalcogenide layers. Silver sulfide, silver oxide, and silver telluride are all suitable silver-chalcogenides that may be used in combination with any suitable metal containing resistance variable material 51. A variety of processes can be used to form the metal containing layer 71. For instance, physical vapor deposition techniques such as evaporative deposition and sputtering may be used. Other processes such as chemical vapor deposition, co-evaporation or depositing a layer of selenium above a layer of silver to form silver-selenide can also be used.

Figure 9B:
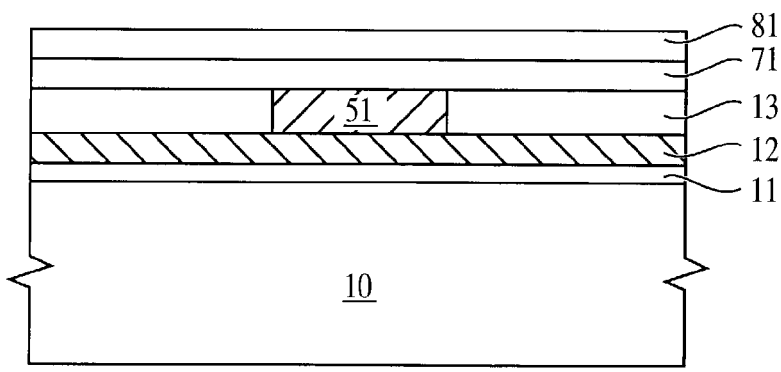
FIG. 9B is a subsequent cross-sectional view taken from FIG. 9A at a stage of processing subsequent to that shown in FIG. 9A in accordance with the second embodiment of the invention.
Figure 10:
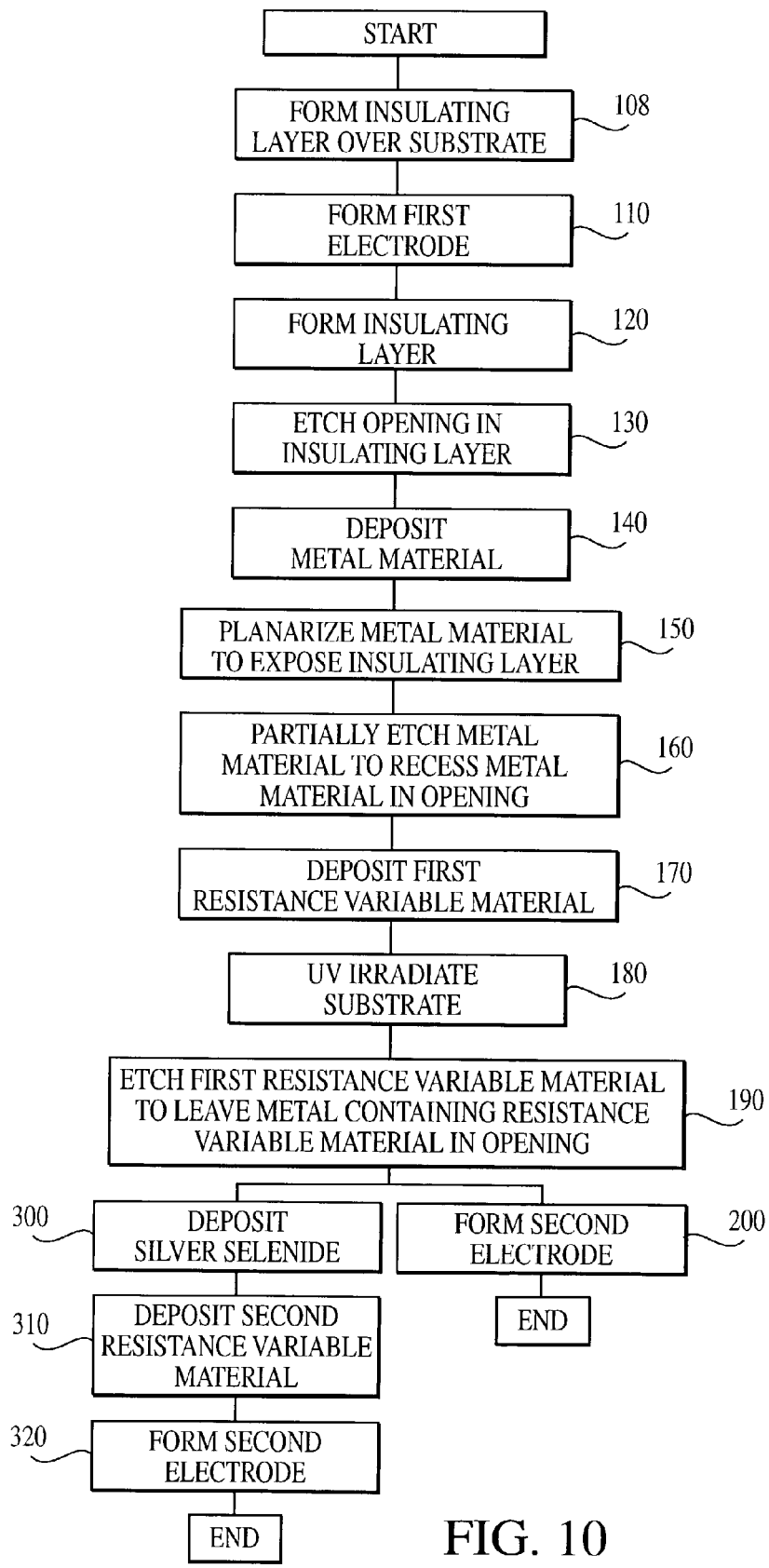
FIG. 10 illustrates a process according to an embodiment of the present invention.

Referring now to FIG. 9B and process segment 310, a second resistance variable material 81, preferably a chalcogenide glass and more preferably a germanium-selenide glass is deposited over the metal containing layer 71. The second germanium-selenide glass composition is preferably one having a $Ge_xSe_{100-x}$ stoichiometry between about $Ge_{20}Se_{80}$ to about $Ge_{43}Se_{57}$ and is more preferably about $Ge_{40}Se_{60}$. The second resistance variable material 41 may be deposited by any known deposition methods, for example, by sputtering, chemical vapor deposition (CVD), plasma enhanced CVD (PECVD) or physical vapor deposition (PVD).

Figure 9C:
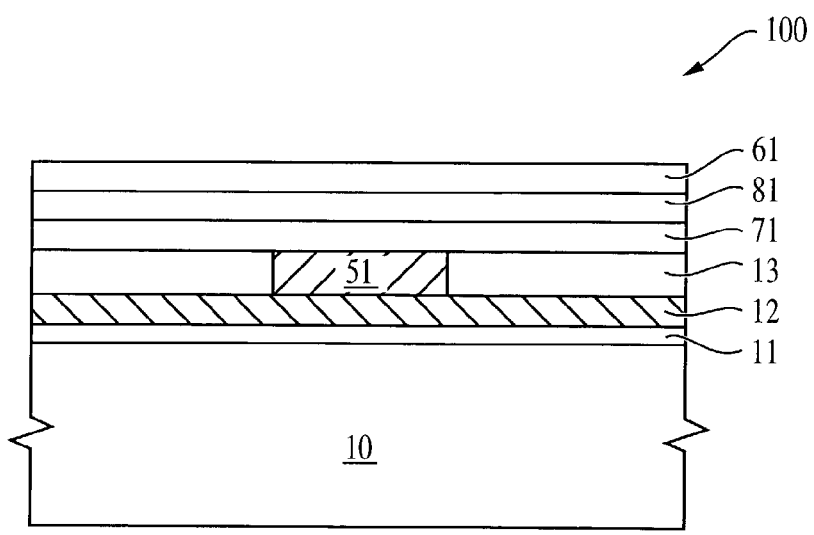
FIG. 9C is a subsequent cross-sectional view taken from FIG. 9B at a stage of processing subsequent to that shown in FIG. 9B in accordance with the second embodiment of the invention.

Referring now to FIG. 9C and process segment 320 of FIG. 10, a second conductive electrode 61 is formed over the second resistance variable material 81 to complete the formation of a resistance variable memory element in accordance with the second embodiment of the invention. The second electrode is preferably formed of tungsten, however any suitable conductive materials may be used to form the second electrode 61.

The resulting structure forms a resistance variable memory element comprising a metal containing resistance variable material 51 (such as a silver-germanium-selenium glass layer), a metal containing layer 71 (such as silver-selenide), a resistance variable material layer 81 (such as a germanium-selenium glass layer), and at least two conductive electrodes, namely electrodes 12 and 61. Conventional processing steps can then be carried out to electrically couple the first and second electrode 12, 61 to various circuits of memory arrays. Providing a metal containing layer 71, such as silver-selenide, over the metal containing resistance variable material 51 and then providing a second resistance variable material 81 over the metal containing layer 71 allows the metal in the metal containing layer 71 to be more readily available for switching.

Figure 11:
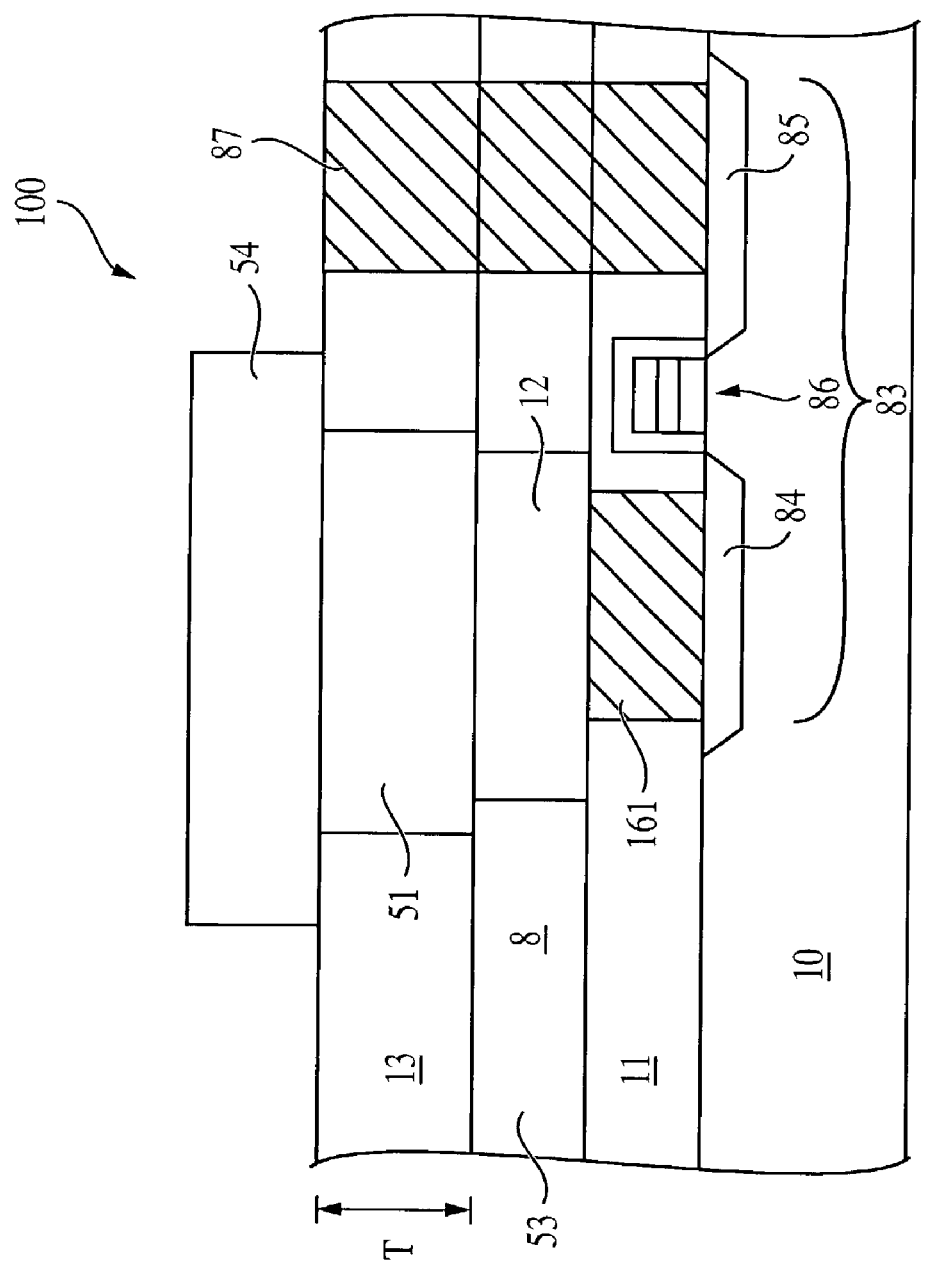
FIG. 11 illustrates an exemplary construction of a resistance variable memory element in accordance with the second embodiment of the invention.

FIG. 11 illustrates an exemplary construction of a resistance variable memory element 100 employing the first embodiment of the invention. A resistance variable memory element 100 in accordance with the first embodiment of the invention is generally fabricated over a semiconductor substrate 10 and comprises a first insulating layer 11 formed over a substrate 10. An access transistor 83 for accessing the memory element is illustrated as having source/drain regions 84, 85 and a gate stack 86. Access circuitry for operating a resistance variable memory cell may be fabricated in substrate 10. The insulating layer 11 is provided over the circuitry, including transistor 83 and contains a conductive plug 161. In accordance with process segment 110, a first metal electrode 12 is formed within a second insulating layer 8 provided over the insulating layer 11 and plug 161. In accordance with process segment 120, a third insulating layer 13 is formed over the first electrode 12 and second insulating layer 8. In accordance with process segment 130, an etched opening is provided. A metal material and a resistance variable material are deposited in the opening and processed via light irradiation in accordance with process segments 140–190 to form a metal containing resistance variable material 51 in the opening of the third insulating layer 13. As described, the metal containing resistance variable material 51 may be a silver-germanium-selenide glass.

In accordance with process segment 200 a second metal electrode 54 is formed in contact with the silver-germanium-selenide glass 51.

The third insulating layer 13 may be formed, for example, between the first electrode 12 and the second electrode 54 of any suitable insulator, for example a nitride, an oxide, or other insulator. The third insulating layer 13 may be formed by any known deposition method, for example, by sputtering, chemical vapor deposition (CVD), plasma enhanced CVD (PECVD) or physical vapor deposition (PVD), among others. A preferred insulating material is silicon nitride, but those skilled in the art will appreciate that there are other numerous suitable insulating materials for this purpose.

The first electrode 12 is electrically connected through conductive plug 161 to a source/drain region 84 of access transistor 83. Source/drain region 85 is connected by another conductive plug 87 to other circuitry of a memory array. The gate of the transistor 83 may be part of a word line which is connected to a plurality of resistance variable memory elements 100 just as a bit line of a memory array may be coupled to a plurality of resistance variable memory elements through plug 87.

Figure 12:
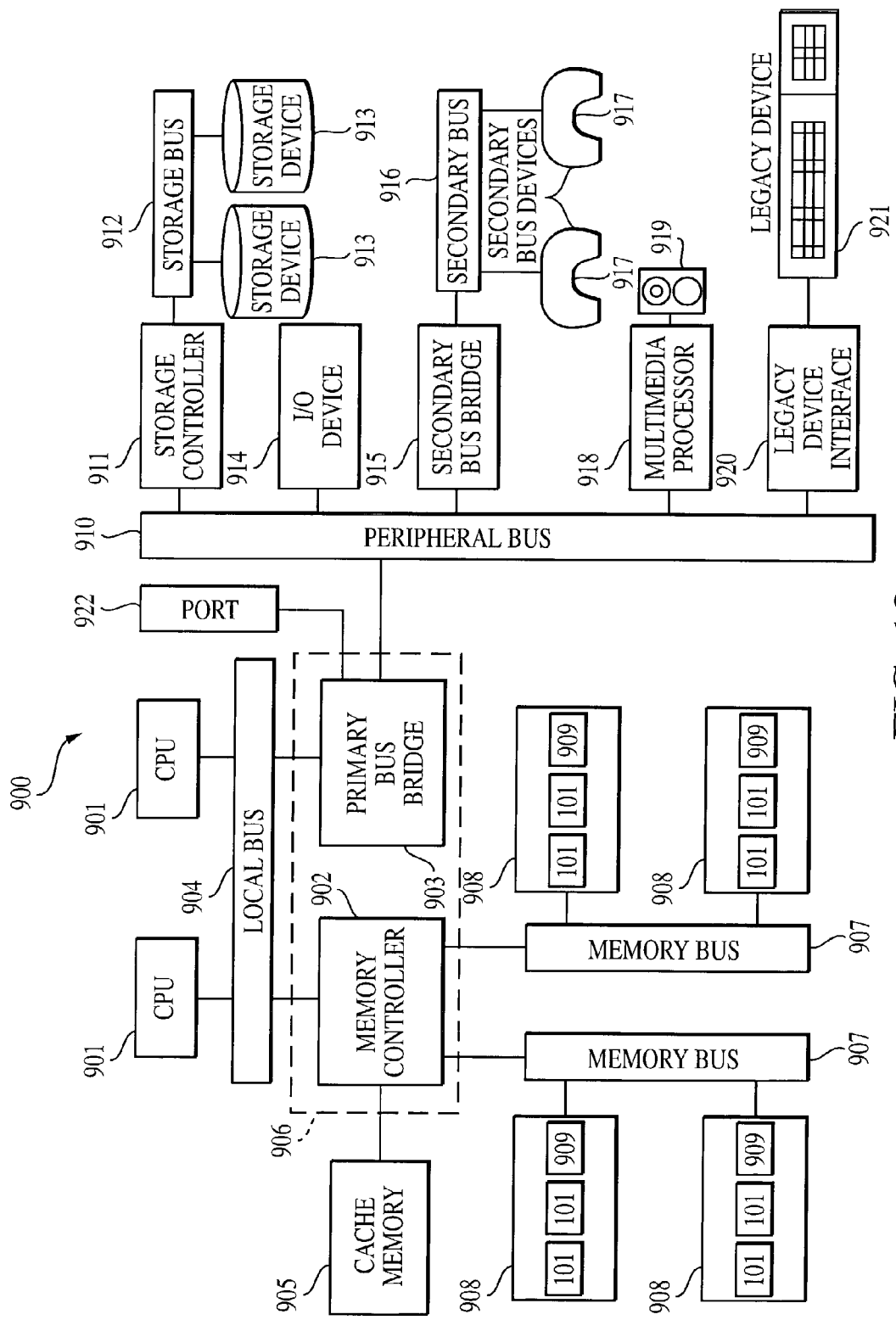
FIG. 12 is a processor based system having one or more memory devices that contains resistance variable memory elements according to the present invention.

The resistance variable memory element 100 of the invention may be used in a random access memory device. FIG. 12 illustrates an exemplary processing system 900 which utilizes a resistance variable memory random access device 101 containing an array of resistance variable memory elements 100 constructed as described above with reference to FIGS. 1–10. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 101 of the invention. Alternatively, in a simplified system, the memory controller 902 may be omitted and the memory components directly coupled to one or more processors 901. The memory components 908 may be a memory card or a memory module. The memory components 908 may include one or more additional devices 909. For example, the additional device 909 might be a configuration memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 12 is only an exemplary processing system with which the invention may be used. While FIG. 12 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory elements 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

The above description and drawings are only to be considered illustrative of exemplary embodiments, which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of fabricating a resistance variable memory element, comprising the acts of:
   forming a first electrode;
   forming an insulating layer over said first electrode;
   forming an opening in said insulating layer to expose a portion said first electrode;
   forming a metal containing layer in said opening;
   forming a resistance variable material over said metal containing layer in said opening;
   processing said resistance variable material and metal containing layer to diffuse metal from said metal containing layer into said resistance variable material to form a metal containing resistance variable material in said opening;
   selectively etching any remaining resistance variable material after said processing to leave said metal containing resistance variable material in said opening; and
   forming a second electrode over said insulating layer and over said metal containing resistance variable material.

2. The method of claim 1 wherein said act of forming said metal containing layer in said opening further comprises forming said metal containing layer over said insulating layer and planarizing said formed metal containing layer to expose a surface of said insulating layer.

3. The method of claim 2 further comprising the act of:
   removing a portion of said metal containing layer to recess said metal containing layer in said opening prior to forming said resistance variable material in said opening.

4. The method of claim 3 wherein less than about 50% of said metal containing layer is removed to recess said metal containing layer within said opening.

5. The method of claim 4 wherein about 40% to about 50% of said metal containing layer is removed to recess said metal containing layer in said opening.

6. The method of claim 1 wherein said act of forming said resistance variable material over said metal containing layer and in said opening further comprises forming said resistance variable material over said insulating layer.

7. The method of claim 6 wherein said act of processing includes irradiating said element with light to form said metal containing resistance variable material in said opening.

8. The method of claim 1, wherein said act of selectively etching comprises dry etching.

9. The method of claim 8 wherein said dry etching uses a $CF_4$ gas.

10. The method of claim 8 wherein said dry etching uses an $SF_6$ gas.

11. The method of claim 1 wherein said act of processing comprises irradiating said resistance variable material and said metal containing layer with light.

12. The method of claim 11 wherein said irradiating is performed for approximately 5 to about 30 minutes at from about 1 mW/cm$^2$ to about 10 mW/cm$^2$ with a light having a wavelength of from about 200 nm to about 600 nm.

13. The method of claim 11 further comprising thermally heating said element at a temperature of about 50° C. to about 300° C. for about 5 to about 15 minutes.

14. The method of claim 13 wherein said heating is performed at a temperature of about 110° C.

15. The method of claim 1 wherein said metal containing layer comprises a silver layer.

16. The method of claim 15 wherein said resistance variable material comprises germanium-selenium.

17. The method of claim 16 wherein said germanium-selenium has a stoichiometry of from $Ge_{20}Se_{80}$ to about $Ge_{33}Se_{67}$.

18. The method of claim 16 wherein said germanium-selenium has a stoichiometry of about $Ge_{25}Se_{75}$.

19. The method of claim 16 wherein said metal containing resistance variable material comprises silver-germanium-selenium.

20. The method of claim 1 wherein said metal containing layer comprises a silver-selenide layer.

21. The method of claim 1 further comprising forming a second metal containing layer over said metal containing resistance variable material prior to forming said second electrode.

22. The method of claim 21 wherein said second metal containing layer comprises a silver-selenide layer.

23. The method of claim 21 further comprising depositing a second resistance variable material over said second metal containing layer.

24. The method of claim 23 wherein said second resistance variable material comprises germanium-selenium.

25. The method of claim 24 wherein said germanium-selenium composition has a stoichiometry of from about $Ge_{20}Se_{80}$ to about $Ge_{43}Se_{57}$.

26. The method of claim 25 wherein said germanium-selenium composition has a stoichiometry of about $Ge_{40}Se_{60}$.

27. A method of fabricating a resistance variable memory element, comprising the acts of:
   forming a first electrode on a substrate:
   forming an insulating layer overlying said first electrode;
   etching an opening in said insulating layer to expose said first electrode;
   depositing a silver containing material in said opening and overlying said insulating layer;
   planarizing said silver containing material to expose said insulating layer;
   recessing said silver containing material in said opening;
   depositing a germanium-selenium layer overlying said recessed silver containing material and said insulating layer;
   processing said germanium-selenium layer and said silver containing material with light irradiation to form a silver-germanium-selenium material in said opening;
   subsequent to said processing act, removing any residual germanium-selenium layer overlying said insulating layer; and
   forming a second electrode overlying said insulating layer and said silver-germanium-selenium material formed in said opening.

28. The method of claim 27 wherein said act of recessing said silver containing material in said opening comprises wet etching said silver containing material in the presence of $HNO_3$ and $H_2O$.

29. The method of claim 27 wherein said silver containing material is recessed to less than 50% of the depth of said opening.

30. The method of claim 29 wherein said silver containing material is recessed to between about 40% to about 50% of the depth of said opening.

31. The method of claim 27 wherein said act of removing any residual germanium-selenium layer comprises dry etching said any residual germanium-selenium layer in the presence of $CF_4$.

32. The method of claim 27 wherein said act of removing any residual germanium-selenium layer comprises dry etching said any residual germanium-selenium layer in the presence of $SF_6$.

33. The method of claim 27 wherein said light irradiation is performed for approximately 5 to about 30 minutes at from about 1 $mW/cm^2$ to about 10 $mW/cm^2$ with a light having a wavelength of from about 200 nm to about 600 nm.

34. The method of claim 27 further comprising thermally heating said element at a temperature from about 50° C. to about 300° C. for about 5 to about 15 minutes.

35. The method of claim 34 comprising thermally heating said element at about 110° C.

36. The method of claim 27 wherein said silver containing material comprises silver-selenide.

37. The method of claim 27 wherein said germanium-selenium layer has a stoichiometry of from about $Ge_{20}Se_{80}$ to about $Ge_{33}Se_{67}$.

38. The method of claim 37 wherein said germanium-selenium layer has a stoichiometry of about $Ge_{25}Se_{75}$.

39. A method of fabricating a resistance variable memory element, comprising the acts of:
forming a first electrode on a substrate:
forming an insulating layer overlying said first electrode;
etching an opening in said insulating layer to expose a portion of said first electrode;
depositing a silver containing material in said opening and overlying said insulating layer;
planarizing said silver containing material to expose said insulating layer;
recessing said silver containing material in said opening;
depositing a first germanium-selenium layer over said recessed silver containing material in said opening and overlying said insulating layer;
processing said first germanium-selenium layer and said silver containing material with light irradiation to form a silver-germanium-selenium material in said opening;
removing any residual portions of said first germanium-selenium layer outside an area of said opening;
depositing a silver-selenide layer overlying said insulating layer and said silver-germanium-selenium material formed in said opening;
forming a second germanium-selenium layer over said silver-selenide layer; and
forming a second electrode over said second germanium-selenium layer.

40. The method of claim 39 wherein said act of recessing said silver containing material in said opening comprises wet etching said silver containing layer in the presence of $HNO_3$ and $H_2O$.

41. The method of claim 39 wherein said silver containing material is recessed to less than 50% of the depth of said opening.

42. The method of claim 41 wherein said silver containing material is recessed to between about 40% to about 50% of the depth of said opening.

43. The method of claim 39 wherein said act of removing residual portions of said first germanium-selenium layer comprises dry etching said residual portions in the presence of $CF_4$.

44. The method of claim 39 wherein said act of removing residual portions of said first germanium-selenium layer comprises dry etching said residual portions in the presence of $SF_6$.

45. The method of claim 39 wherein said light irradiation is performed for approximately 5 to about 30 minutes at from about 1 $mW/cm^2$ to about 10 $mW/cm^2$ with a light having a wavelength of from about 200 nm to about 600 nm.

46. The method of claim 39 further comprising thermally heating said element at a temperature from about 50° C. to about 300° C. for about 5 to about 15 minutes.

47. The method of claim 46 comprising thermally heating said element at about 110° C.

48. The method of claim 39 wherein said first germanium-selenium layer has a stoichiometry of from about $Ge_{20}Se_{80}$ to about $Ge_{33}Se_{67}$.

49. The method of claim 48 wherein said first germanium-selenium layer has a stoichiometry of about $Ge_{25}Se_{75}$.

50. The method of claim 39 wherein said second germanium-selenium layer has a stoichiometry of from about $Ge_{20}Se_{80}$ to about $Ge_{43}Se_{57}$.

51. The method of claim 50 wherein said second germanium-selenium layer has a stoichiometry of about $Ge_{40}Se_{60}$.

52. A self-aligning process for forming a resistance variable memory element, comprising the acts of:
forming an opening in an insulating layer to expose a surface of an underlying conductor;
forming a metal containing layer recessed in said opening;
forming a glass material on said metal containing layer within said opening and over said insulating layer;
processing said glass material to diffuse metal from said metal containing layer into said glass material to form a metal doped glass material within said opening;
subsequent to said processing act, removing any residual glass material formed over said insulating layer and outside an area of said opening; and
forming a second conductor over said metal doped glass material.

53. The method of claim 52 wherein said act of forming a metal containing layer in said opening further comprises forming said metal containing layer over said insulating layer.

54. The method of claim 53 further comprising the act of planarizing said metal containing layer formed over said insulating layer to expose a surface of said insulating layer before recessing said metal containing layer.

55. The method of claim 52 wherein said act of recessing said metal containing layer comprises removing less than about 50% of said metal containing layer in said opening.

56. The method of claim 55 wherein said act of recessing said metal containing layer comprises removing about 40% to about 50% of said metal containing layer in said opening.

57. The method of claim 52 wherein said act of processing said glass material to diffuse said metal into said glass material includes irradiating said glass material and metal containing layer with light.

58. The method of claim 57 wherein said irradiation is performed for approximately 5 to about 30 minutes at from about 1 $mW/cm^2$ to about 10 $mW/cm^2$ with a light having a wavelength of from about 200 nm to about 600 nm.

59. The method of claim 57 further comprising thermally heating said element at a temperature from about 50° C. to about 300° C. for about 5 to about 15 minutes.

60. The method of claim 59 comprising thermally heating said element at about 110° C.

61. The method of claim 52, wherein said act of removing any residual glass material comprises selectively dry etching said any residual glass material.

62. The method of claim 61 wherein said dry etching is performed in the presence of a $CF_4$ gas.

63. The method of claim 61 wherein said dry etching is performed in the presence of a $SF_6$ gas.

64. The method of claim 52 wherein said metal containing layer comprises a silver layer.

65. The method of claim 64 wherein said glass material comprises a germanium-selenium composition.

66. The method of claim 65 wherein said germanium-selenium composition has a stoichiometry of from about $Ge_{20}Se_{80}$ to about $Ge_{33}Se_{67}$.

67. The method of claim 66 wherein said germanium-selenium composition has a stoichiometry of about $Ge_{25}Se_{75}$.

68. The method of claim 65 wherein said metal doped glass material comprises a silver-germanium-selenium composition.

69. The method of claim 68 wherein said silver-germanium-selenium composition has a germanium-selenium stoichiometry of about $Ge_{25}Se_{75}$.

70. The method of claim 52 wherein said metal containing layer comprises a silver-selenide layer.

71. The method of claim 52 further comprising forming a metal-containing layer over said metal doped glass material prior to forming said second conductor.

72. The method of claim 71 wherein said metal-containing layer comprises a silver-selenide layer.

73. The method of claim 71 further comprising depositing a second glass material over said metal-containing layer.

74. The method of claim 73 wherein said second glass material comprises a second germanium-selenium composition.

75. The method of claim 74 wherein said second germanium-selenium composition has a stoichiometry of from about $Ge_{20}Se_{80}$ to about $Ge_{43}Se_{57}$.

76. The method of claim 75 wherein said second germanium-selenium composition has a stoichiometry of about $Ge_{40}Se_{60}$.

77. A method of fabricating a resistance variable memory element, comprising the acts of:
forming an insulating layer having an opening therein;
forming a silver layer recessed in said opening;
forming a germanium-selenium layer in said opening and overlying said silver layer;
processing said silver layer and said germanium-selenium layer to produce a germanium-selenium material having diffused silver therein; and
selectively etching any remaining portion of the germanium-selenium material which does not have silver diffused therein after said processing.

78. The method of claim 77 wherein said act of forming said silver layer in said opening further comprises forming said silver layer over said insulating layer and planarizing said silver layer to expose a surface of said insulating layer.

79. The method of claim 78 further comprising the act of:
removing a portion of said silver layer to recess said silver layer in said opening.

80. The method of claim 79 wherein less than 50% of said metal material is removed to recess said silver layer in said opening.

81. The method of claim 80 wherein about 40% to about 50% of said silver layer is removed to recess said silver layer in said opening.

82. The method of claim 77 wherein said act of forming said germanium-selenium layer overlying said silver layer and in said opening further comprises forming said germanium-selenium layer over said insulating layer.

83. The method of claim 77, wherein said act of selectively etching comprises dry etching.

84. The method of claim 83 wherein said dry etching uses a $CF_4$ gas.

85. The method of claim 83 wherein said dry etching uses a $SF_6$ gas.

86. The method of claim 77 wherein said processing comprises the act of irradiating said element with light to form said germanium-selenium material having silver diffused therein.

87. The method of claim 77 wherein said germanium-selenium layer has a stoichiometry of about $Ge_{20}Se_{80}$ to about $Ge_{43}Se_{57}$.

88. The method of claim 87 wherein said germanium-selenium layer has a stoichiometry of about $Ge_{25}Se_{75}$.

89. A method of fabricating a resistance variable memory element, comprising the acts of:
forming an insulating layer having an opening therein;
forming a metal containing layer in said opening;
forming a resistance variable material over said metal containing layer in said opening;
processing said resistance variable material and metal containing layer to diffuse metal from said metal containing layer into said resistance variable material to form a metal containing resistance variable material in said opening; and
after said processing, selectively etching any remaining resistance variable material that does not have said metal diffused therein.

* * * * *

UNITED STATES PATENT AND TRADEMARK OFFICE
CERTIFICATE OF CORRECTION

| | | |
|---|---|---|
| PATENT NO. | : 7,018,863 B2 | |
| APPLICATION NO. | : 10/225190 | |
| DATED | : March 28, 2006 | |
| INVENTOR(S) | : John T. Moore et al. | |

It is certified that error appears in the above-identified patent and that said Letters Patent is hereby corrected as shown below:

Column 7, lines 63-64, "coupled the" should read --coupled to the--;

Column 8, line 16, "include" should read --includes--;

Column 8, lines 27-28, "an miscellaneous" should read --a miscellaneous--;

Column 8, line 29, "an legacy" should read --a legacy--;

Column 8, line 30, "also coupled" should read --also be coupled--;

Column 8, line 40, "an local" should read --a local--;

Column 8, line 44, "an universal" should read --a universal--;

Column 8, line 45, "via to the" should read --via the--;

Column 8, line 48, "to one additional" should read --to additional--; and

Column 8, line 66, "system" should read --system--.

In the Claims, the following error is corrected:

Claim 1, column 9, line 21, "portion said" should read --portion of said--.

In the Other Publications portion of the References Cited section, the following errors are corrected:

"Deamaley, G.; Stoneham, A.M.,; Morgan, D.V., Electrical phenomena in amorphous oxide films, Rep. Prog. Phys. 33 (1970) 1129-1191."

Should read

--Dearnaley, G.; Stoneham, A.M.; Morgan, D.V., Electrical phenomena in amorphous oxide films, Rep. Prog. Phys. 33 (1970) 1129-1191.--;

UNITED STATES PATENT AND TRADEMARK OFFICE
CERTIFICATE OF CORRECTION

PATENT NO. : 7,018,863 B2
APPLICATION NO. : 10/225190
DATED : March 28, 2006
INVENTOR(S) : John T. Moore et al.

It is certified that error appears in the above-identified patent and that said Letters Patent is hereby corrected as shown below:

"Hegab, N.A.; Fadel, M.; Sedeek, K., Memory switching phenomena in thin films of chalcogenide semiconductors, Vacuum 45 (1994) 459-462."

Should read

--Hegab, N.A.; Fadel, M.; Sedeek, K., Memory switching phenomena in thin films of chalcogenide semiconductors, Vacuum 45 (1994) 459-462.--;

"Ishikawa, R.; Kikuchi, M., Photovoltaic study on the photo-enhanced diffusion of Ag in amorphous fims of $Ge_2S_3$, J. Non-Cryst Solids 35 & 36 (1980) 1061-1066."

Should read

--Ishikawa, R.; Kikuchi, M., Photovoltaic study on the photo-enhanced diffusion of Ag in amorphous films of $Ge_2S_3$, J. Non-Cryst. Solids 35 & 36 (1980) 1061-1066.--;

"Joullie, A.M.; Marruchi, J., On the DC electrical conduction of amorphous $As_2Se_7$ before swithing, Phys. Stat. Sol. (a) 13 (1972) K105-K109."

Should read

--Joullie, A.M.; Marruchi, J., On the DC electrical conduction of amorphous $As_2Se_7$ before switching, Phys. Stat. Sol. (a) 13 (1972) K105-K109.--;

"Lakshminarayan, K.N.; Srivastava, K.K.; Panwar, O.S.: Dunmar, A., Amorphous semiconductor devices: memory and swithing mechanism, J. Instn. Electronics & Telecom. Engrs. 27 (1981) 16-19."

Should read

--Lakshminarayan, K.N.; Srivastava, K.K.; Panwar, O.S.: Dunmar, A., Amorphous semiconductor devices: memory and switching mechanism, J. Instn. Electronics & Telecom. Engrs. 27 (1981) 16-19.--;

UNITED STATES PATENT AND TRADEMARK OFFICE
CERTIFICATE OF CORRECTION

PATENT NO. : 7,018,863 B2
APPLICATION NO. : 10/225190
DATED : March 28, 2006
INVENTOR(S) : John T. Moore et al.

It is certified that error appears in the above-identified patent and that said Letters Patent is hereby corrected as shown below:

"Lal, M.; Goyal, N., Chemical bond appraoch to study the memory and thershold swithing chalcogenide glasses, Indian Jornal of pure & appl. Phys. 29 (1991) 303-304."

Should read

--Lal., M.; Goyal, N., Chemical bond approach to study the memory and threshold switching chalcogenide glasses, Indian Journal of Pure & Appl. Phys. 29 (1991) 303-304.--;

"Pinto, R.; Ramanathan, K.V., Electric field induced memory swithing in thin films of the chalcogenide system Ge-As-Se, Appl. Phys. Lett. 19 (1971) 221-223."

Should read

--Pinto, R.; Ramanathan, K.V., Electric field induced memory switching in thin films of the chalcogenide system Ge-As-Se, Appl. Phys. Lett. 19 (1971) 221-223.--;

"Popescu, C., The effect of local non-uniformities on thermal swithing and high field behavior of structures with chalcogenide glasses, Solid-State electronics 18 (1975) 671-681."

Should read

--Popescu, C., The effect of local non-uniformities on thermal switching and high field behavior of structures with chalcogenide glasses, Solid-state Electronics 18 (1975) 671-681.--;

"McHardy et al., *The dissolution of metals in amorphous chalcogenides and the effects o electron and ultraviolet radiation*, 20 J. Phys. C.: Solid State Phys., pp. 4055-4075 (1987)f."

Should read

--McHardy et al., *The dissolution of metals in amorphous chalcogenides and the effects of electron and ultraviolet radiation*, 20 J. Phys. C.: Solid State Phys., pp. 4055-4075 (1987).--;

UNITED STATES PATENT AND TRADEMARK OFFICE
CERTIFICATE OF CORRECTION

PATENT NO. : 7,018,863 B2
APPLICATION NO. : 10/225190
DATED : March 28, 2006
INVENTOR(S) : John T. Moore et al.

It is certified that error appears in the above-identified patent and that said Letters Patent is hereby corrected as shown below:

"Kotkata, M.F.; Afif, M.A.; Labib, H.H.; Hebab, N.A.; Abdel-Aziz, M.M., Memory switching in amorphous GeSeTi chalcogenide semiconductor films, Thin Solid Films 240 (1994) 143-146."

Should read

--Kotkata, M.F.; Afifi, M.A.; Labib, H.H.; Hebab, N.A.; Abdel-Aziz, M.M., Memory switching in amorphous GeSeTi chalcogenide semiconductor films, Thin Soild Films 240 (1994) 143-146.--;

"Rose, M.J.; Snell, A.J.; Lecomber, P.G.; Hajto, J.; Fitzgerald, A.G.; Owen, A.E., Aspects of non-volatility in a –Si:H memory devices, Mat. Res. Soc. Symp. Proc. V 258, 1992, 1075-1980."

Should read

--Rose, M.J.; Snell, A.J.; Lecomber, P.G.; Hajto, J.; Fitzgerald, A.G.; Owen, A.E., Aspects of non-volatility in metal/a –Si:H/metal memory devices, Mat. Res. Soc. Symp. Proc. V 258 (1992) 1075-1080.--; and

UNITED STATES PATENT AND TRADEMARK OFFICE
CERTIFICATE OF CORRECTION

PATENT NO. : 7,018,863 B2
APPLICATION NO. : 10/225190
DATED : March 28, 2006
INVENTOR(S) : John T. Moore et al.

It is certified that error appears in the above-identified patent and that said Letters Patent is hereby corrected as shown below:

"Tranchant, S.; Peytavin, S.; Ribes, M.; Flank, A.M.; Dexpert, H.; Lagarde, J.P., Silver chalcogenide glasses Ag-Ge-Se: Ionic conduction and exafs structural investigation, Transport-structure relations in fast ion and mixed conductors Proceedings of the 6th Riso International Symposium, Sep. 9-13, 1985."

Should read

--Tranchant, S.; Peytavin, S.; Ribes, M.; Flank, A.M.; Dexpert, H., Lagarde, J.P., Silver chalcogenide glasses Ag-Ge-Se: Ionic conduction and EXAFS structural investigation, Transport-structure relations in fast ion and mixed conductors, Proc. of the 6th RISO Int'l. Symp., Sep. 9-13, 1985.--.

Signed and Sealed this

Fifth Day of September, 2006

JON W. DUDAS
*Director of the United States Patent and Trademark Office*